United States Patent [19]

Chiyajo et al.

[11] Patent Number: 4,977,042
[45] Date of Patent: Dec. 11, 1990

[54] RECHARGEABLE TYPE SMALL ELECTRIC APPLIANCE

[75] Inventors: Masanobu Chiyajo; Toshio Kuroki, both of Fukuoka; Eiji Sakata, Tagawa, all of Japan

[73] Assignee: Kyushu Hitachi Maxell, Ltd., Tagawa, Japan

[21] Appl. No.: 446,762

[22] Filed: Dec. 6, 1989

[51] Int. Cl.⁵ .................................. H01M 2/02
[52] U.S. Cl. ................................ 429/49; 429/100; 320/2
[58] Field of Search .............. 429/96, 97, 98, 100, 429/49; 220/2

[56] References Cited

U.S. PATENT DOCUMENTS

| | | | |
|---|---|---|---|
| 3,181,974 | 5/1965 | Barbera | 429/100 |
| 3,445,297 | 5/1969 | Sidell | 429/98 |
| 4,086,523 | 4/1978 | Izumi | 320/2 |
| 4,247,603 | 1/1981 | Leffingwell et al. | 429/49 |
| 4,269,908 | 5/1981 | Stemme | 429/100 |

Primary Examiner—Donald L. Walton
Attorney, Agent, or Firm—Wenderoth, Lind & Ponack

[57] ABSTRACT

A rechargeable type small electric appliance including a rechargeable battery having negative and positive terminals, the negative and positive terminals being, respectively, connected to a wiring board by a pair of lead members, in which at least one of the lead members is bent in an inverse U-shape so as to have first and second pieces and a bent portion connecting the first and second pieces, the first piece being secured to the wiring board, while the second piece is clamped, at a clamp portion thereof, to a corresponding one of the negative and positive terminals, the bent portion projecting outwardly beyond the clamp portion of the second piece in a radial direction of the rechargeable battery.

15 Claims, 45 Drawing Sheets

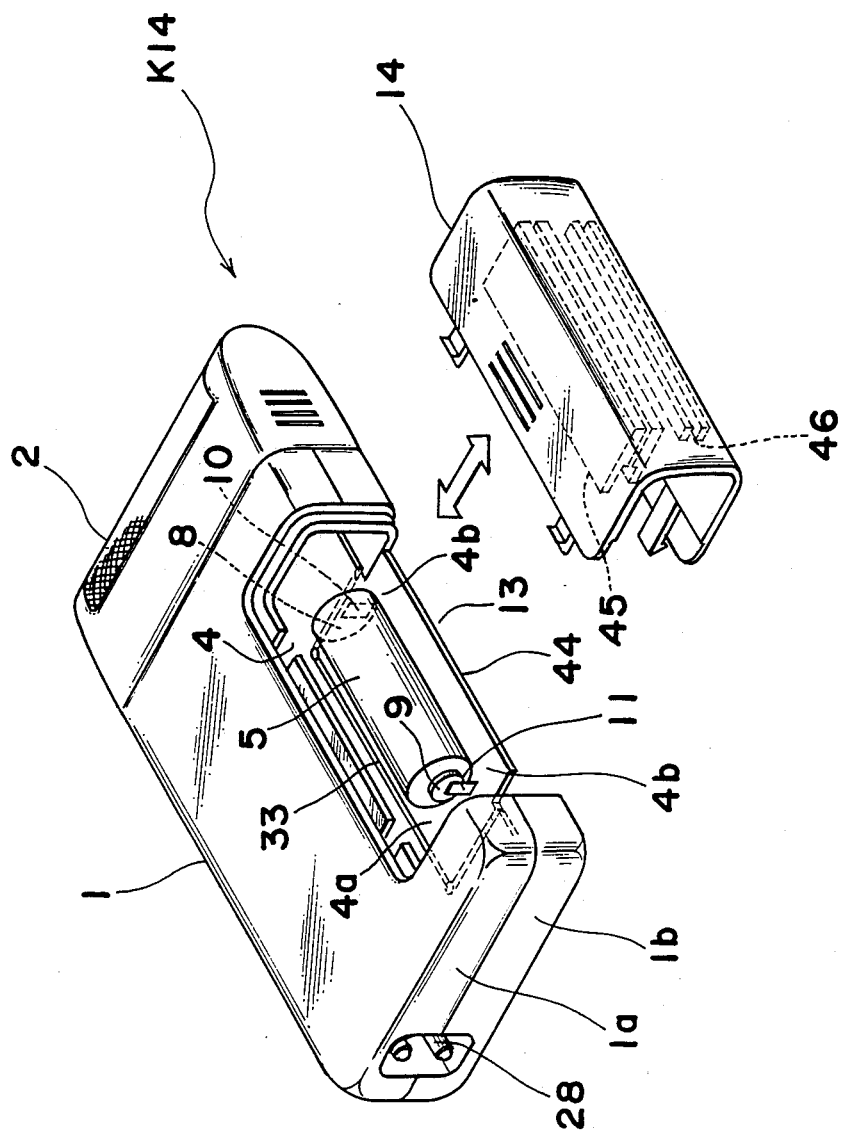

RECHARGEABLE TYPE SMALL ELECTRIC APPLIANCE

BACKGROUND OF THE INVENTION

The present invention generally relates to electric appliances and more particularly, to a small electric appliance incorporating a rechargeable battery, in which a measure for removing the rechargeable battery therefrom is taken.

Of recent years, in small electric appliances such as an electric shaver, etc., rechargeable batteries, which can be used repetitively, are mainly employed in place of dry cells. However, rechargeable batteries, for example, Ni-Cd (nickel-cadmium) batteries contain harmful substances such as cadmium. Therefore, from a standpoint of prevention of environmental pollution, it is not desirable to discard the Ni-Cd batteries together with the electric appliances anywhere. Thus, when the electric appliances incorporating the Ni-Cd batteries are discarded, the Ni-Cd batteries are required to be removed from the electric appliances so as to be collected for their safe disposal.

However, in contrast with the dry cells, the rechargeable batteries cannot be removed from the electric appliances easily. In the case where the rechargeable batteries are accommodated in the electric appliances by using contact terminal plates formed by coiled springs, leaf springs, etc. in the same manner as the dry cells, contact resistance of the contact terminal plates increases with lapse of time and thus, the rechargeable batteries cannot exhibit such a feature that the rechargeable batteries are capable of generating large electric current. Hence, it becomes inevitably necessary to securely connect the rechargeable batteries to circuits in the electric appliances by spot welding, soldering, etc. In this case, unless soldered portions are removed or lead wires are cut by using a nipper, pliers, etc., the rechargeable batteries cannot be removed from the electric appliances. Especially, in the case where removal of the rechargeable batteries is not performed by servicemen for the electric appliances but is performed by general users, this operation has been extremely troublesome due to the fact that the users usually do not possess special tools for removing the rechargeable batteries. Meanwhile, in the known electric appliances, such a safety countermeasure is not taken that even if charging of the electric appliances is performed inadvertently after the rechargeable battery has been remove from the electric appliances, electric current is not inputted to a load side of the electric appliances.

As shown in FIG. 1, even in the case where lead members 30 are cut in a known electric appliance, sufficient space enabling insertion of the nipper, pliers, etc. thereinto is not defined between the lead member 30 and a rechargeable battery 5 or a wiring board 4, cutting of the lead members 30 has been quite difficult.

However, as shown in FIG. 2, if the rechargeable battery 5 is placed on a pair of support pieces 31 so as to be spaced a certain distance from the wiring board 4 such that space S is defined between the rechargeable battery 5 and the wiring board 4, the lead members 30 can be cut easily by inserting the nipper, etc. into the space S. However, since the rechargeable battery 5 is disposed extremely high, the rechargeable battery 5 is not stably accommodated in a casing of the known electric appliance.

Meanwhile, the known electric appliances have such a risk that if an operator inadvertently removes the rechargeable battery from the known electric appliances when the rechargeable battery is being charged by connecting the rechargeable battery to an external power source, the operator may receive an electric shock.

Furthermore, in the known electric appliances, if the rechargeable battery is removed from the known electric appliances by cutting the lead wires when not only electric power of the rechargeable battery has not yet vanished but a power source switch of the known electric appliances is in an ON state, there is such a danger as generation of sparks from cut portions of the lead wires.

SUMMARY OF THE INVENTION

Accordingly, an essential object of the present invention is to provide, with a view to eliminating the above mentioned drawbacks of the conventional rechargeable type small electric appliances, a rechargeable type small electric appliance in which removal of a rechargeable battery is simplified such that collection of the rechargeable battery for its safe disposal is facilitated.

Another important object of the present invention is to provide a rechargeable type small electric appliance in which a safety countermeasure is taken such that electric current is not applied to a load side of the electric appliance even if charging of the electric appliance is performed inadvertently after the rechargeable battery has been removed from the electric appliance.

Still another object of the present invention is to provide a rechargeable type small electric appliance in which safety of removal of the rechargeable battery is insured.

In order to accomplish these objects of the present invention, a rechargeable type small electric appliance according to one embodiment of the present invention includes a rechargeable battery having negative and positive terminals, the negative and positive terminals being, respectively, connected to a wiring board by a pair of lead members, wherein at least one of the lead members is bent in an inverse U-shape so as to have first and second pieces and a bent portion connecting the first and second pieces, the first piece being secured to the wiring board, while the second piece is clamped, at a clamp portion thereof, to a corresponding one of the negative and positive terminals, the bent portion projecting outwardly beyond the clamp portion of the second piece in a radial direction of the rechargeable battery.

In accordance with the present invention, when the rechargeable battery is removed from the electric appliance so as to be collected for its safe disposal, the rechargeable battery can be detached from the wiring board by cutting the bent portion of the lead member with a nipper, etc. At this time, the bent portion of the lead member projects outwardly beyond the clamp portion of the second piece in the radial direction of the rechargeable battery. Thus, even if the rechargeable battery is compactly mounted on the wiring board so as to have a small height from the wiring board, the nipper, etc. can be used without their interference with the rechargeable battery or the wiring board.

BRIEF DESCRIPTION OF THE DRAWINGS

These objects and features of the present invention will become apparent from the following description taken in conjunction with the preferred embodiments thereof with reference to the accompanying drawings in which:

FIG. 38 is a perspective view showing a state in which a lid has been removed from the electric appliance of FIG. 37;

FIG. 60c is a fragmentary front elevational view showing a state in which a lid has been removed from the electric appliance of FIG. 60a;

Before the description of the present invention proceeds, it is to be noted that like parts are designated by like reference numerals throughout several views of the accompanying drawings.

DETAILED DESCRIPTION OF THE INVENTION

Figure 1:
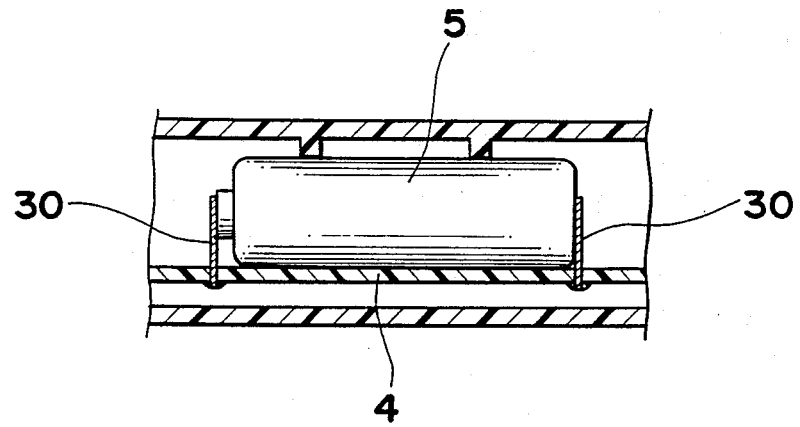
FIG. 1 is a fragmentary longitudinal sectional view of a prior art rechargeable type small electric appliance (already referred to)
Figure 2:
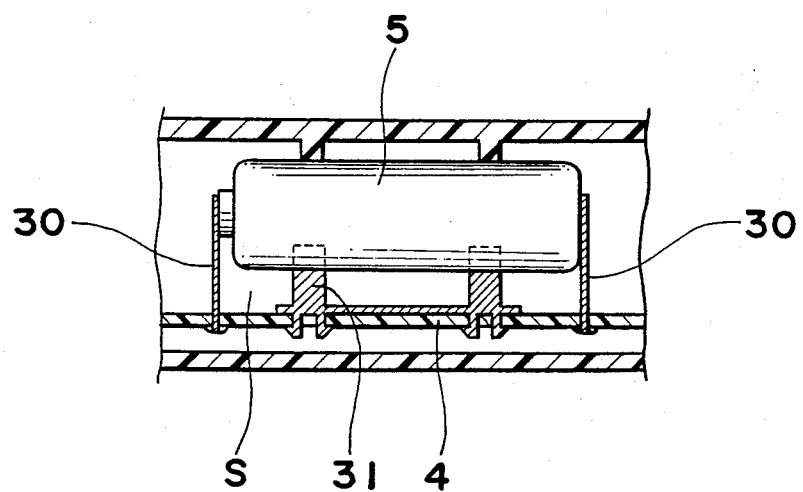
FIG. 2 is a fragmentary longitudinal sectional view of another prior art rechargeable type small electric appliance (already referred to)

Hereinbelow, a rechargeable type electric shaver K1 to which a rechargeable type small electric appliance according to a first embodiment of the present invention may be applied is described with reference to FIGS. 3 to 6. In FIG. 4, the electric shaver K1 includes a rectangular casing 1, a shaving blade unit 2 provided at an upper portion of the casing 1 and a charging plug 3 provided at a bottom portion of the casing 1. The charging plug 3 has a pair of retractable plug blades. In the casing 1, a motor (not shown) for driving the shaving blade unit 2, a rechargeable battery 5, for example, a Ni-Cd (nickel-cadmium) battery acting as a power source for the motor, etc. are accommodated. A battery outlet 13 opens at one side face 1A and a front face 1B or a rear face perpendicular to the side face 1A. The battery outlet 13 is closed by a lid 14 having an L-shaped cross section.

Figure 3:
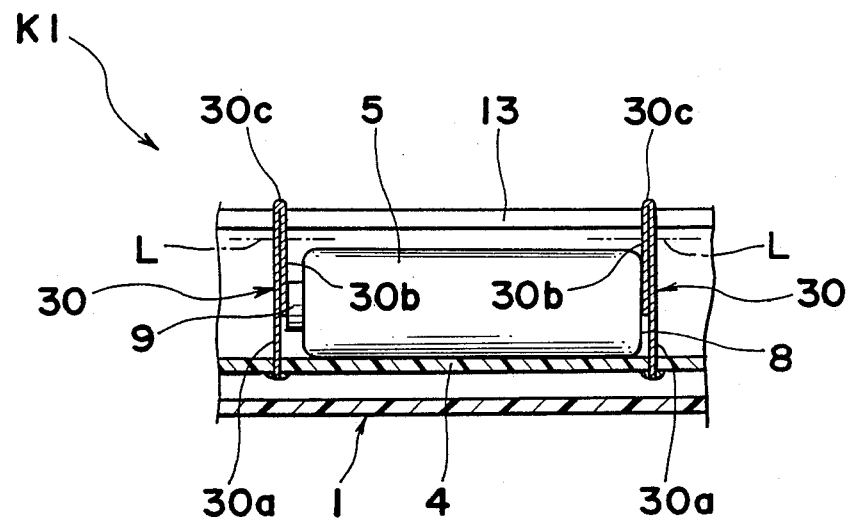
FIG. 3 is a fragmentary longitudinal sectional view showing a state in which a rechargeable battery has been mounted on a wiring board in a rechargeable type small electric appliance according to a first embodiment of the present invention.
Figure 4:
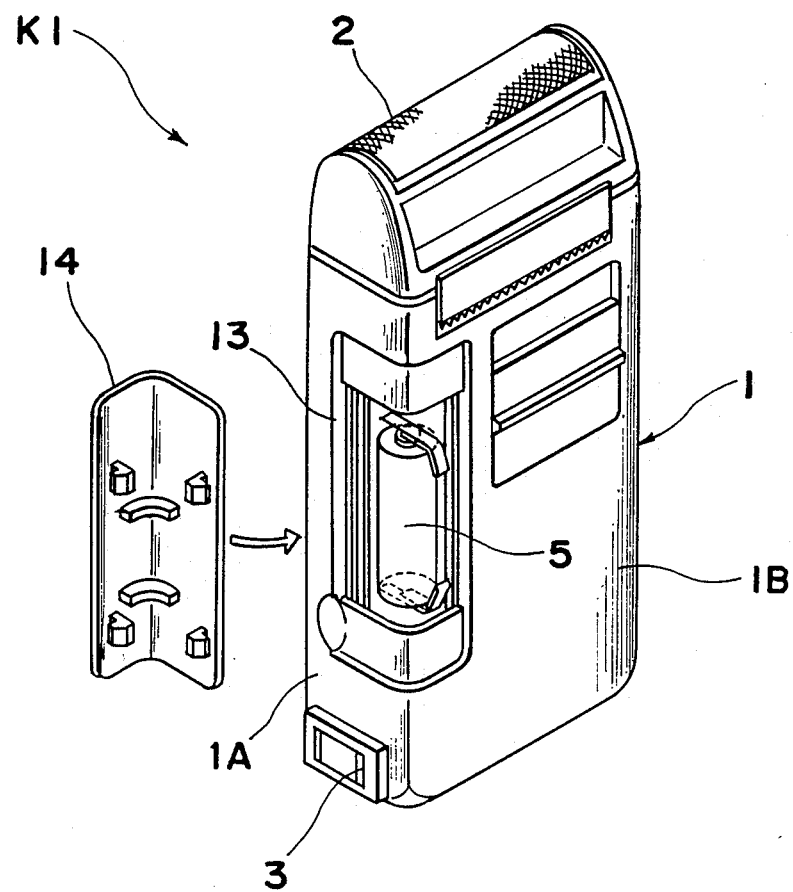
FIG. 4 is perspective view showing a state in which a lid has been removed from the electric appliance of FIG. 3.
Figure 6:
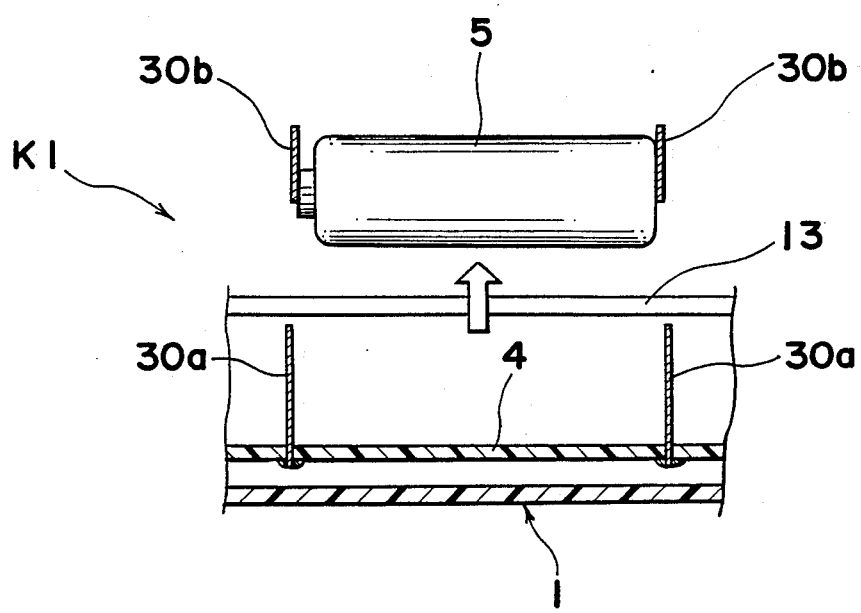
FIG. 6 is a fragmentary longitudinal sectional view showing a state in which the rechargeable battery has been removed from the wiring board in the electric appliance of FIG. 3.

In FIG. 3, the rechargeable battery 5 is mounted on a wiring board 4 having a predetermined circuit pattern, by a pair of lead members 30 formed by, for example, lead wires, lead plates, etc. The lead member 30 is bent in an inverse U-shape so as to have a first piece 30a, a second piece 30b and a bent portion 30c connecting the first and second pieces 30a and 30b. A lower end portion of the first piece 30a is connected to the wiring board 4 by soldering, etc., while a lower end portion of the second piece 30b is connected to a negative terminal 8 of the rechargeable battery 5 by spot welding, etc. The bent portion 30c between the first and second pieces 30a and 30b projects in a radial direction of the rechargeable battery 5 outwardly beyond the lower end portion of the second piece 30b, which is clamped to the negative terminal 8 of the rechargeable battery 5. Namely, the bent portion 30c projects upwardly beyond an outside diameter of the rechargeable battery 5. It is to be noted that the lead member 30 is connected to a positive terminal 9 of the rechargeable battery 5 in the same manner as the lead member 30 connected to the negative terminal 8.

Figure 5:
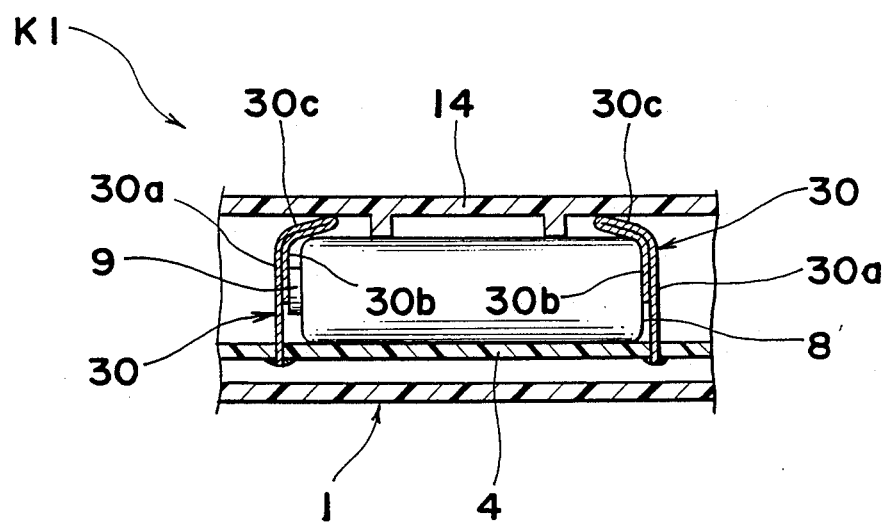
FIG. 5 is a fragmentary longitudinal sectional view showing a state in which the rechargeable battery has been accommodated in the electric appliance of FIG. 3.

In the case where the bent portions 30c interfere with the lid 14 when the rechargeable battery. 5 is accommodated in the casing 1, the bent portions 30c may be folded onto the rechargeable battery 5 as shown in FIG. 5. If an elastic force is imparted to the bent portions 30c so as to be urged towards the rechargeable battery 5 by an inner face of the lid 14 at the time when the bent portions 30c are folded onto the rechargeable battery 5, the rechargeable battery 5 is depressed by the elastic bent portions 30c so as to eliminate play of the rechargeable battery 5.

When the rechargeable battery 5 is taken out of the casing 1 so as to be collected for its safe disposal, the lid 14 is opened and the bent portions 30c are cut along the line L in FIG. 3 by a nipper, etc. When the bent portions 30c are folded onto the rechargeable battery 5 as shown in FIG. 5 in this case, the bent portions 30c are raised from the rechargeable battery 5 and then, are cut by a nipper, etc. The bent portions 30c projects in the radial direction of the rechargeable battery 5 outwardly beyond the clamp portions of the second pieces 30b clamped to the negative and positive terminals 8 and 9 of the rechargeable battery 5, respectively. Thus, even if the rechargeable battery 5 is closely mounted on the wiring board 4 without being spaced away from the wiring board 4 so as to be compactly accommodated in the casing 1, this cutting operation can be easily performed without interference with the rechargeable battery 5 or the wiring board 4.

When the bent portions 30c of the lead members 30 have been cut as described above, the rechargeable battery 5 can be removed from the wiring board 4 in a state where the first pieces 30a and the second pieces 30b are, respectively, attached to the wiring board 4 and the rechargeable battery 5.

Figure 7:
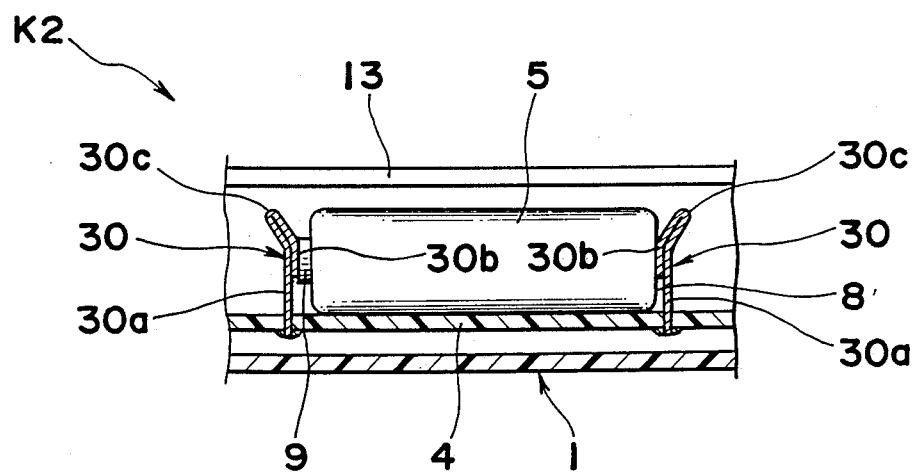
FIGS. 7 and 8 are views similar to FIG. 3, particularly showing second and third embodiments of the present invention, respectively.

FIG. 7 shows a rechargeable type electric shaver K2 according to a second embodiment of the present invention. In the electric shaver K1, the bent portions 30c of the lead members 30 project through a sufficient length upwardly beyond the outside diameter of the rechargeable battery 5 in order to not only simplify cutting operation of the lead members 30 with a nipper, etc. but eliminate play of the rechargeable battery 5. However, the bent portions 30c of the lead members 30 are not necessarily required to project through the sufficient length upwardly beyond the outside diameter of the rechargeable battery 5. Namely, as shown in FIG. 7, only if the bent portions 30c project in the radial direction of the rechargeable battery 5 outwardly beyond the clamp portions of the second pieces 30b clamped to the negative and positive terminals 8 and 9 of the rechargeable battery 5, cutting operation of the lead members 30 can be performed easily by using a nipper, etc. even when the bent portions 30c are disposed within the outside diameter of the rechargeable battery 5.

Figure 8:
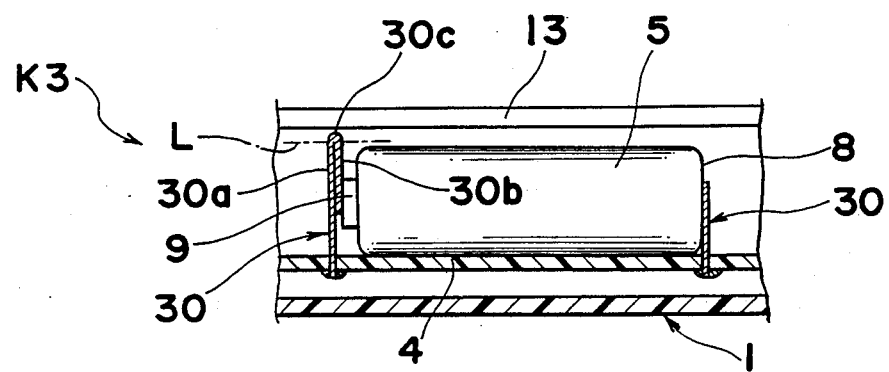
Figure 9:
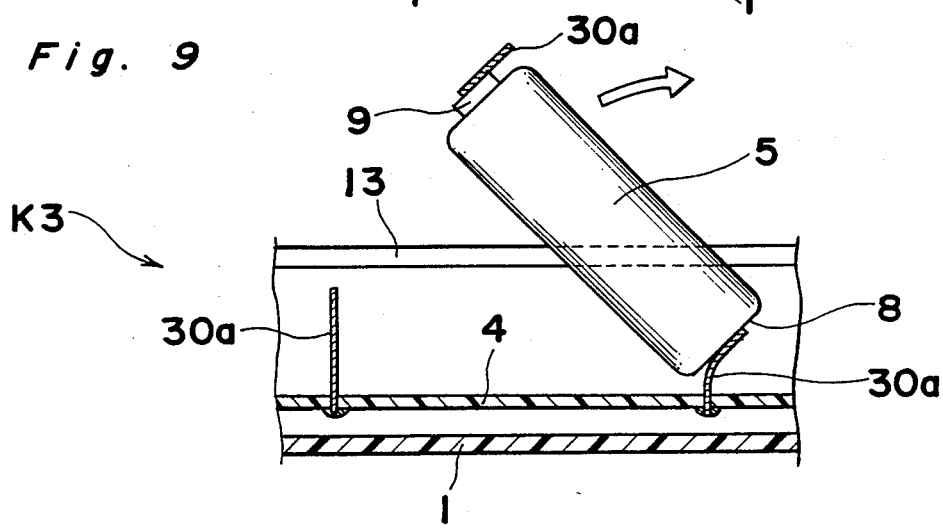
FIGS. 9 and 10 are views showing processes of removal of the rechargeable battery from the wiring board in the electric appliance of FIG. 8.
Figure 10:
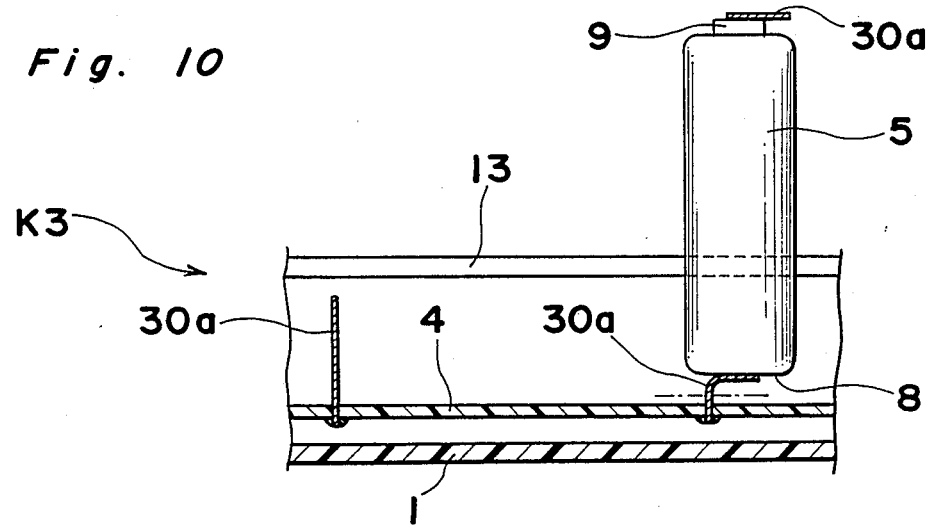

FIGS. 8 to 10 show a rechargeable type electric shaver K3 according to a third embodiment of the present invention. In the electric shavers K1 and K2, both of the lead members 30 provided at the negative and positive terminals 8 and 9 of the rechargeable battery 5 are bent in an inverse U-shape such that the bent portions 30c of the lead members 30 project in the radial direction of the rechargeable battery 5 outwardly beyond the clamp portions of the second pieces 30b clamped to the negative and positive terminals 8 and 9 of the rechargeable battery 5. On the other hand, in the electric shaver K3, only one of the lead members 30 connected to the negative and positive terminals 8 and 9 of the rechargeable battery 5, for example, one lead member 30 connected to the positive terminal 9 is bent in an inverse U-shape. In this case, the bent portion 30c of the lead member 30 bent in an inverse U-shape is initially cut along the line L as shown in FIG. 8. Subsequently, when the rechargeable battery 5 is raised from the wiring board 4 as shown in FIGS. 9 and 10, space allowing insertion of a nipper, etc. thereinto can be defined between the wiring board 4 and the negative terminal 8 of the rechargeable battery 5 connected to the other lead member 30, so that the other lead member 30 connected to the negative terminal 8 can also be cut easily.

In the rechargeable type small electric appliance according to the first to third embodiments of the present invention, the lead member 30 for connecting at least one of the terminals of the rechargeable battery 5 to the wiring board 4 is bent in an inverse U-shape and the bent portion 30c of the lead member 30 projects in the radial direction of the rechargeable battery 5 outwardly beyond the clamp portion of the second piece 30b clamped to the terminal of the rechargeable battery. Therefore, the rechargeable battery 5 can be compactly mounted on the wiring board 4 without being spaced away from the wiring board 4, so that spaced required for accommodating the rechargeable battery 4 in the small electric appliance is reduced.

Furthermore, in the small electric appliance according to the first to third embodiments of the present invention, since cutting operation of the lead member 30 can be preformed easily by using a nipper, etc., removal of the rechargeable battery 4 from the small electric appliance and collection of the rechargeable battery 5 for its safe disposal can be performed easily and efficiently.

Figure 11:
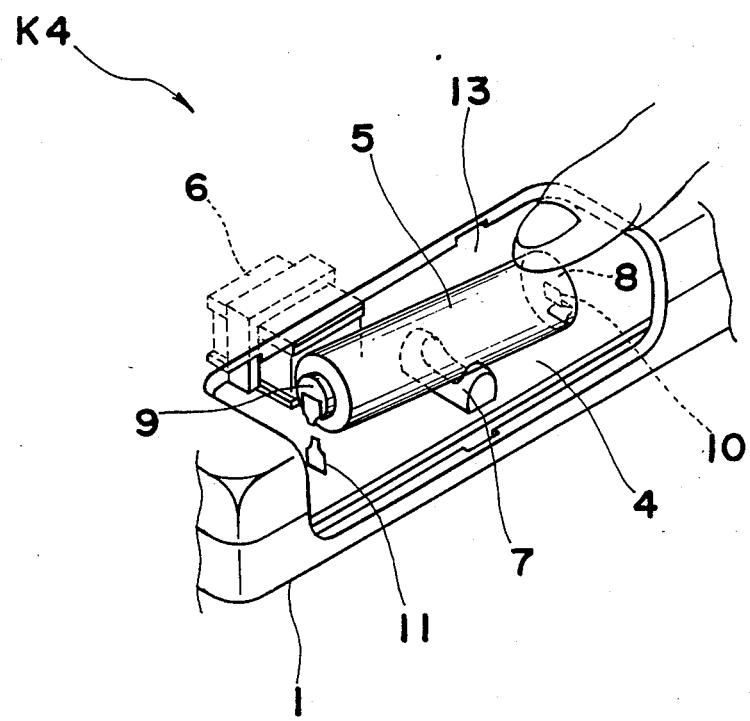
FIG. 11 is a fragmentary perspective view of a rechargeable type small electric appliance according to a fourth embodiment of the present invention.
Figure 12:
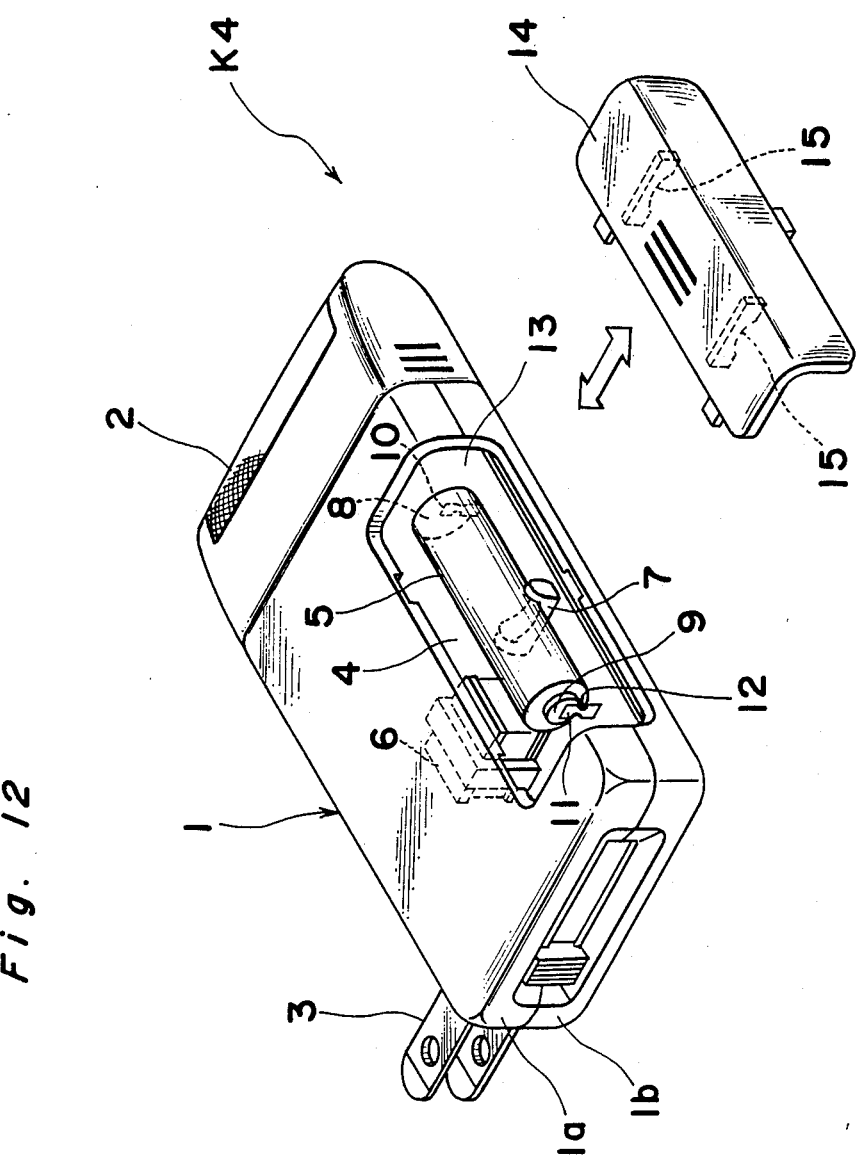
FIG. 12 is a perspective view showing a state in which a lid has been removed from the electric appliance of FIG. 11.
Figure 13:
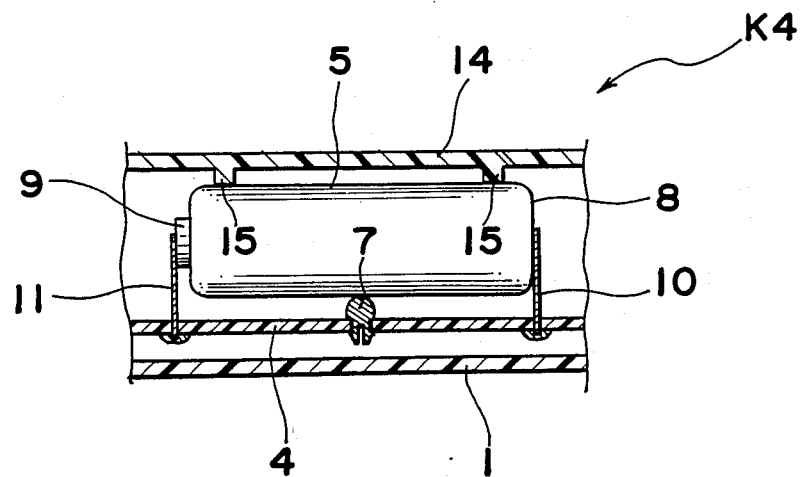
FIG. 13 is a fragmentary longitudinal sectional view of the electric appliance of FIG. 11.

FIGS. 11 to 16 show a rechargeable type electric shaver K4 according to a fourth embodiment of the present invention. In FIG. 12, the casing 1 of the electric shaver K4 is split into a front casing 1a and a rear casing 1b. The front and rear casings 1a and 1b are integrally coupled with each other by screws, etc. The rechargeable battery 5, a transformer 6, etc. are mounted on the wiring board 4. The lid 14 is detachably attached to the battery outlet 13. The rechargeable battery 5 mounted on the wiring board 4 is so disposed as to confront the battery outlet 13.

On the wiring board 4, a longitudinal center of the rechargeable battery 5 is placed on a support base 7 press fitted into a bore of the wiring board 4 such that opposite ends of the rechargeable battery 5 are spaced away from the wiring board 4 The negative and positive terminals 8 and 9 of the rechargeable battery 5 are, respectively, connected to lead pieces 10 and 11 by soldering, etc. such that the rechargeable battery 5 is normally held in a horizontal orientation. A pair of projections 15 for depressing the rechargeable battery 5 are formed on an inner face of the lid 14. When the lid 14 has been attached to the battery outlet 13, the projections 15 depress the rechargeable battery 5 at opposite sides of the support base 7 so as to securely hold the rechargeable battery 5 in the casing 1.

Figure 14:
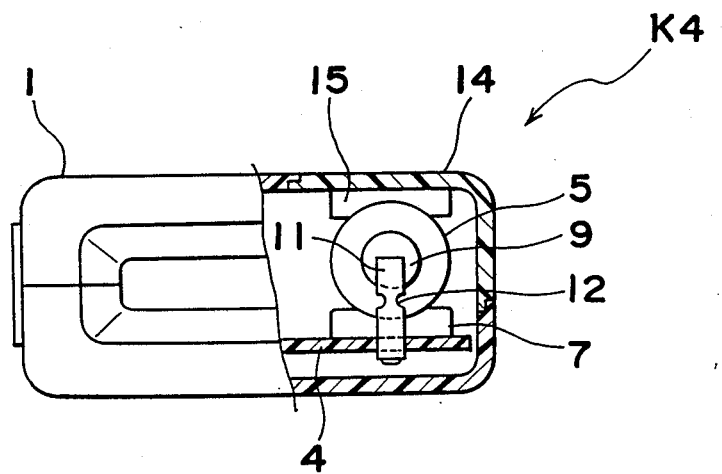
FIG. 14 is a partially sectional bottom plan view of the electric appliance of FIG. 11.

In FIG. 14, each of the lead pieces 10 and 11 is formed, at its central portion, with a constricted part 12 such that the lead pieces 10 and 11 can be readily fractured at the constricted part 12 upon application of a predetermined external force or more thereto. The constricted part 12 is so set as to be fractured by stress concentration when the lid 14 is opened and a tensile load is applied to the lead pieces 10 and 11 by pivotally swinging the rechargeable battery 5 vertically at the support base 7 as a fulcrum with a finger as shown in FIG. 11.

Figure 15:
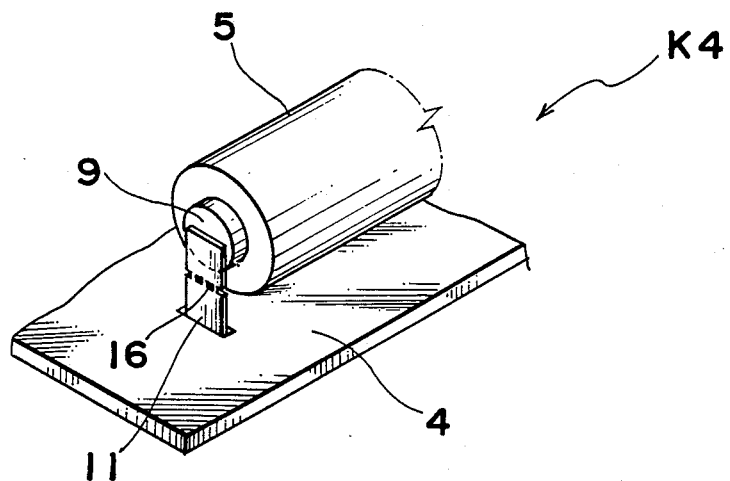
FIGS. 15 and 16 are perspective views showing a modified lead piece and a further modified lead piece employed in the electric appliance of FIG. 11, respectively.
Figure 16:
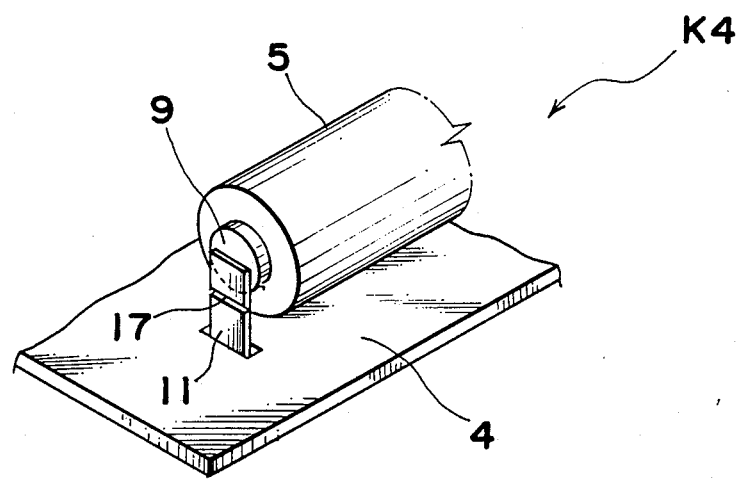

Each of the lead pieces 10 and 11 is formed by a thin sheet, a foil, a thin wire made of copper, etc. Especially, a copper foil of 35 μm in thickness is preferable as material of the lead pieces 10 and 11 because such lead pieces 10 and 11 are readily fractured upon pivotal swing of the rechargeable battery 5. Meanwhile, in order to readily fracture the lead pieces 10 and 11, the constricted part 12 may be replaced by perforations 16 formed at a central portion of each of the lead pieces 10 and 11 as shown in FIG. 15 or a groove 17 formed on each of the lead pieces 10 and 11 as shown in FIG. 16.

Figure 17:
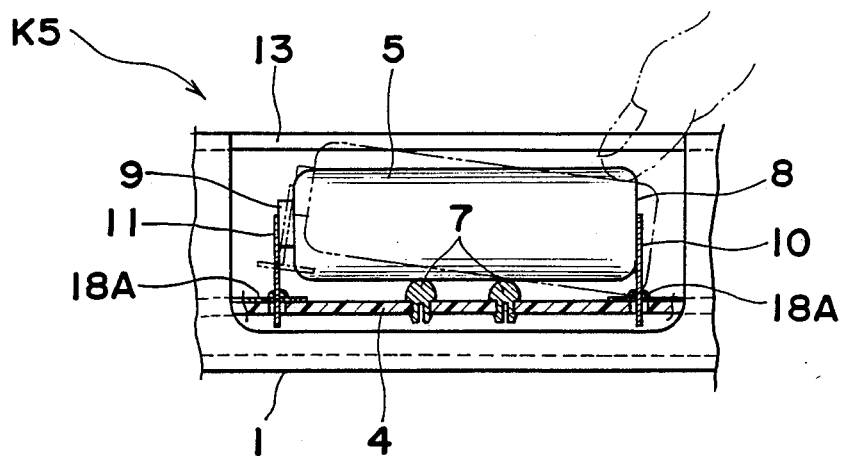
FIG. 17 is a fragmentary longitudinal sectional view of a rechargeable type small electric appliance according to a fifth embodiment of the present invention.
Figure 18:
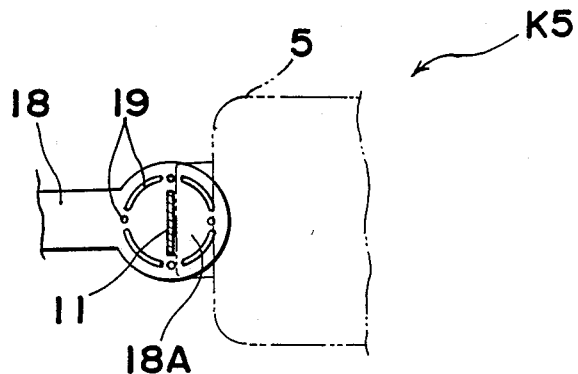
FIG. 18 is a fragmentary top plan view of a wiring board employed in the electric appliance of FIG. 17.

FIGS. 17 and 18 show a rechargeable type electric shaver K5 according to a fifth embodiment of the present invention. In the electric shaver K5, the center of the rechargeable battery 5 is placed on the support base 7 on the wiring board 4 such that the opposite ends of the rechargeable battery 5 are alternately pivotally swung vertically in the same manner as the electric shaver K4. A pattern 18 on the wiring board 4 has a junction portion 18A connected to each of the lead pieces 10 and 11. The electric shaver K5 is different from the electric shaver K4 in that in the electric shaver K5, the junction portion 18A is torn off upon pivotal swing of the rechargeable battery 5. A plurality of pores 19 are formed along an overall peripheral circumference of the junction portion 18A of the pattern 18 such that the junction portion 18A can be torn off positively. It should be noted that two or more support bases 7 may also be provided as shown in FIG. 17.

Figure 19:
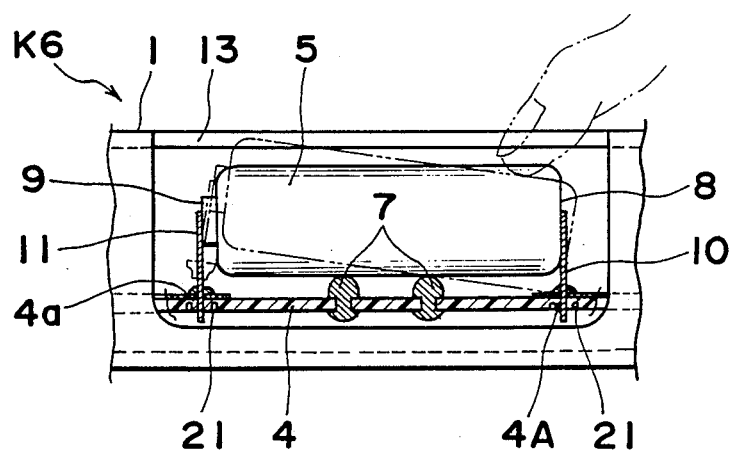
FIG. 19 is a view similar to FIG. 17, particularly showing a sixth embodiment of the present invention.

FIG. 19 shows a rechargeable type electric shaver K6 according to a sixth embodiment of the present invention. In the electric shaver K6, the center of the rechargeable battery 5 is placed on the support bases 7 such that the opposite ends of the rechargeable battery 5 is pivotally swung alternately with a finger in the same manner as the electric shaver K4. The wiring board 4 has a joint portion 4A attached to each of the lead pieces 10 and 11. The electric shaver K6 is different from the electric shaver K4 in that in the electric shaver K6, the joint portion 4A is torn off upon pivotal swing of the rechargeable battery 5. A plurality of notches 21 are formed along an overall peripheral circumference of the joint portion 4A of the wiring board 4 such that fracture of the joint portion 4A can be performed positively and easily. Meanwhile, the support bases 7 are mounted on the wiring board 4 by fusion bonding or insert molding.

Figure 20:
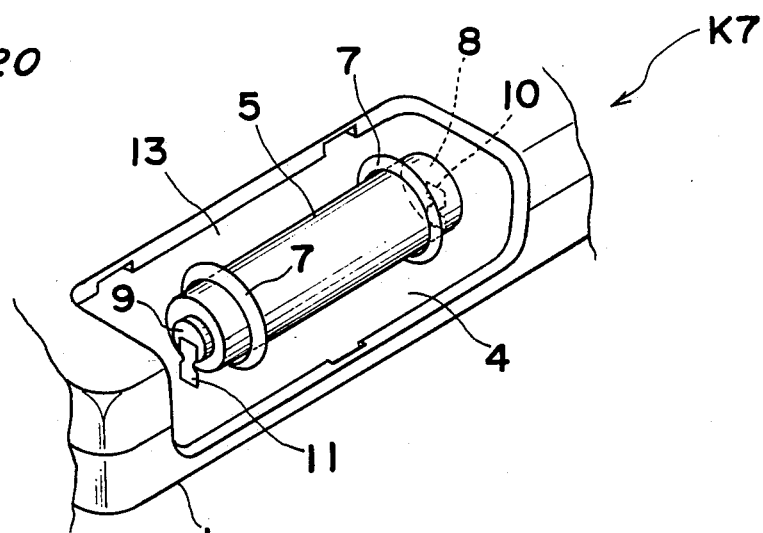
FIG. 20 is a fragmentary perspective view of a rechargeable type small electric appliance according to a seventh embodiment of the present invention.
Figure 21:
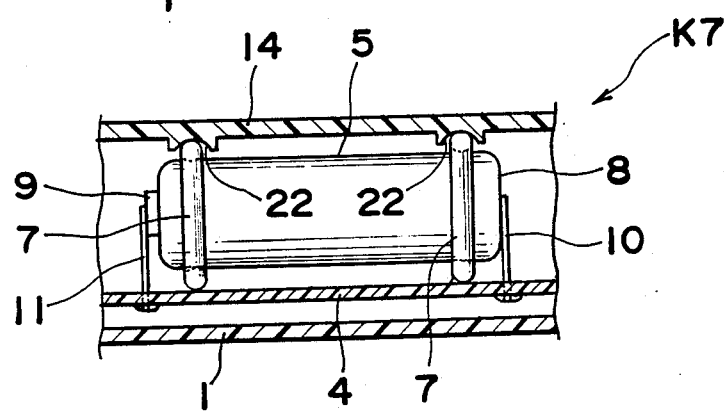
FIG. 21 is a fragmentary longitudinal sectional view of the electric appliance of FIG. 20.
Figure 22:
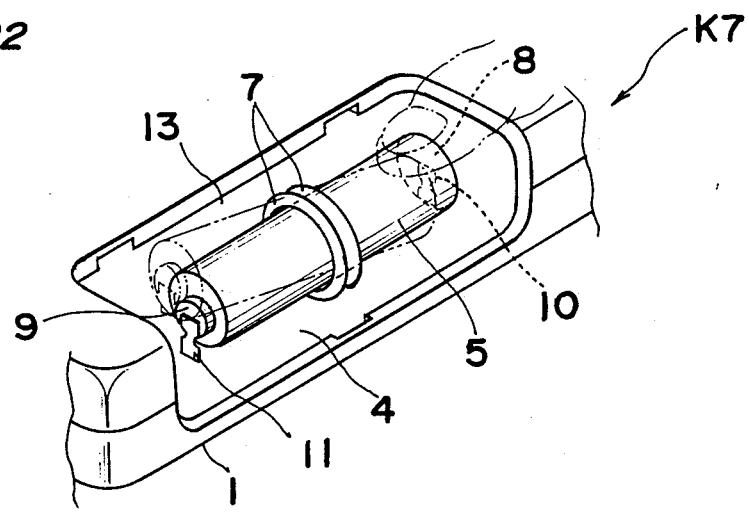
FIG. 22 is a view similar to FIG. 20, particularly showing a cutting procedure of a joint portion connected to a terminal of a rechargeable battery in the electric appliance of FIG. 20.

FIGS. 20 to 22 show a rechargeable type electric shaver K7 according to a seventh embodiment of the present invention. In the electric shaver K7, the support base 7 is formed into an annular shape and the rechargeable battery 5 is fitted through two such support bases 7 so as to be mounted on the wiring board 4. The negative and positive terminals 8 and 9 of the rechargeable battery 5 are, respectively, connected to the lead pieces 10 and 11 on the wiring board 4 by soldering, etc. in the same manner as the above described electric shavers K4 to K6. A pair of retainer portions 22 for retaining the support bases 7, respectively are formed on the inner face of the lid 14. As shown in FIG. 21, the support bases 7 are usually spaced a large distance from each other so as to be gripped by the retainer portions 22 such that displacement of the support bases 7 is prevented by the retainer portions 22. Therefore, in this case, the support bases 7 exhibit also a function to eliminate play of the rechargeable battery 5 in the casing 1. At the time of removal of the rechargeable battery 5 from the casing 1, the lid 14 is detached from the casing 1 and the support bases 7 are slid to a central portion of the rechargeable battery 5 so as to be used as a fulcrum for pivotal swing of the opposite ends of the rechargeable battery 5.

Figure 23:
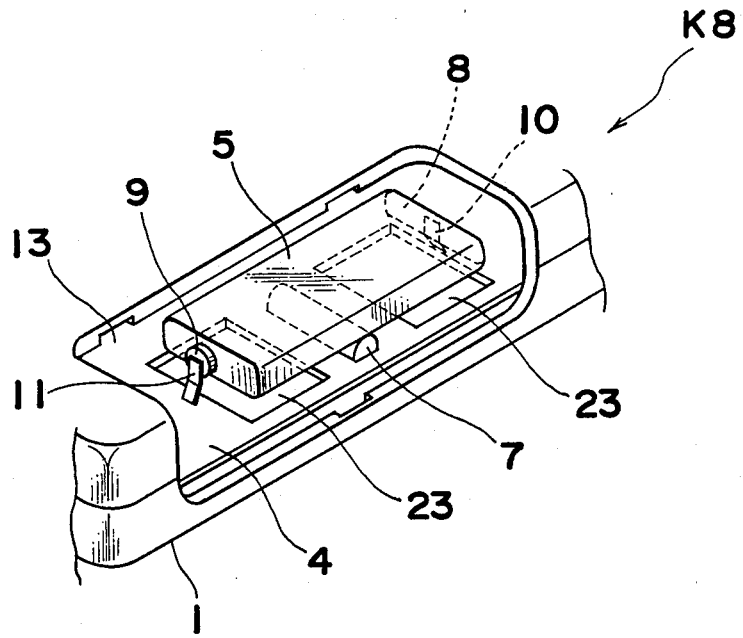
FIG. 23 is a view similar to FIG. 20, particularly showing an eighth embodiment of the present invention.
Figure 24:
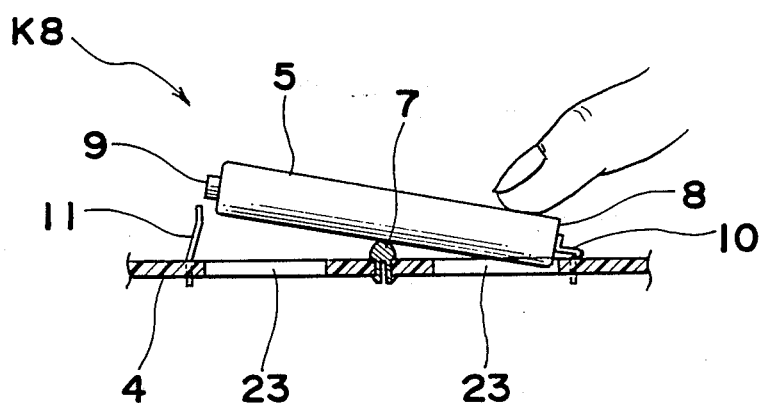
FIG. 24 is a longitudinal sectional view showing a state in which a rechargeable battery has been removed from the electric appliance of FIG. 23.

FIGS. 23 and 24 show a rechargeable type electric shaver K8 according to an eighth embodiment of the present invention. In the electric shaver K8, one support base 7 is employed and a pair of openings 23 are formed on the wiring board 4 at opposite sides of the support base 7 such that the opposite ends of the rechargeable battery 5 are pivotally swung at the support base 7 as a fulcrum in the openings 23. Upon pivotal swing of the rechargeable battery 5, spot welded portions between the negative terminal 8 and the lead piece 10 and between the positive terminal 9 and the lead piece 11 are torn off.

In the electric shaver K8, since the openings 23 are formed on the wiring board 4, height of the support base 7 can be minimized, so that the casing 1 can be made thin. In this case, if a rectangular thin battery shown in FIG. 23 is employed as the rechargeable battery 5, height of the casing 1 can be made smaller.

Figure 25:
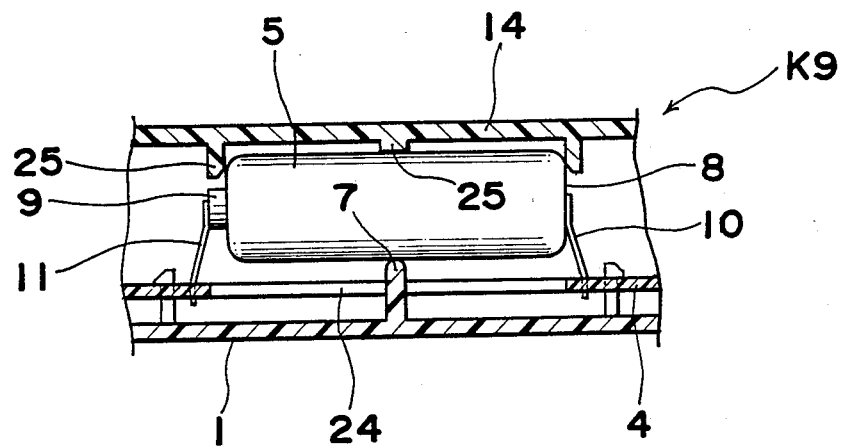
FIG. 25 is a view similar to FIG. 21, particularly showing a ninth embodiment of the present invention.
Figure 26:
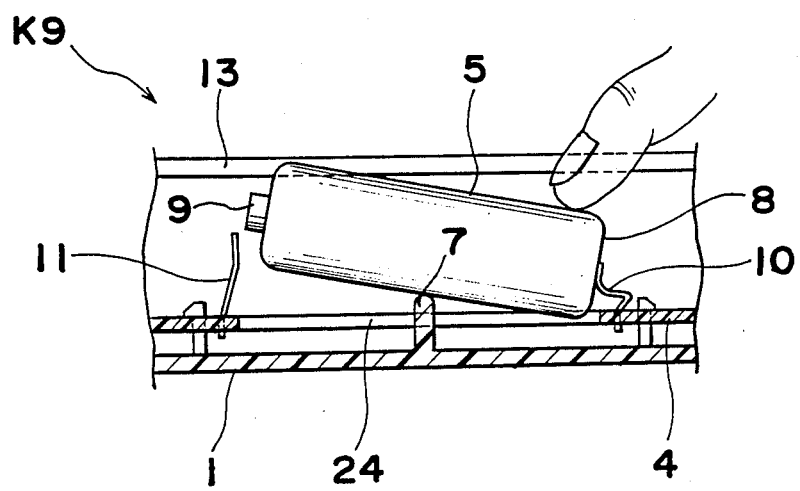
FIG. 26 is a longitudinal sectional view showing a state in which a rechargeable battery has been removed from the electric appliance of FIG. 25.

FIGS. 25 and 26 show a rechargeable type electric shaver K9 according to a ninth embodiment of the present invention. In the electric shaver K9, an opening 24 is formed on the wiring board 4 at a location immediately below the rechargeable battery 5, while one support base 7 for supporting the center of the rechargeable battery 5 projects from the inner face of the casing 1 through the opening 24. Meanwhile, a plurality of protrusions 25 are formed on the inner face of the lid 14 so as to grip the outer peripheral portions of the rechargeable battery 5.

Thus, when the rechargeable battery 5 is pivotally swung at the support base 7 as a fulcrum as shown in FIG. 26, the spot welded portions between the negative terminal 8 and the lead piece 10 and between the positive terminal 9 and the lead piece 11 are torn off in the same manner as the electric shaver K8.

Meanwhile, in the fourth to ninth embodiments of the present invention, it can also be so arranged that when the rechargeable battery 5 is taken out of the casing 1, the rechargeable battery 5 is removed from the wiring board 4 as in the electric shavers K4 to K9 by detaching the front and rear casings 1a and 1b of the casing 1 from each other. In this case, the battery outlet 13 of the casing 1 and the lid 14 are not required to be provided.

It is needless to say that the fourth to ninth embodiments of the present invention can be applied to not only a case in which a single rechargeable battery 5 is mounted on the wiring board 4 but also a case in which two or more rechargeable batteries 5 are mounted on the wiring board 4.

In the rechargeable type small electric appliance according to the fourth to ninth embodiments of the present invention, the rechargeable battery 5 is pivotally swung at the support base 7 as a fulcrum on the wiring board 4 with a hand, etc. such that the joint portions of the wiring board connected to the terminals of the rechargeable battery are fractured. Therefore, since the rechargeable battery 5 can be easily removed from the wiring board 4, the rechargeable battery 5 can be conveniently collected from the electric appliance.

Figure 27:
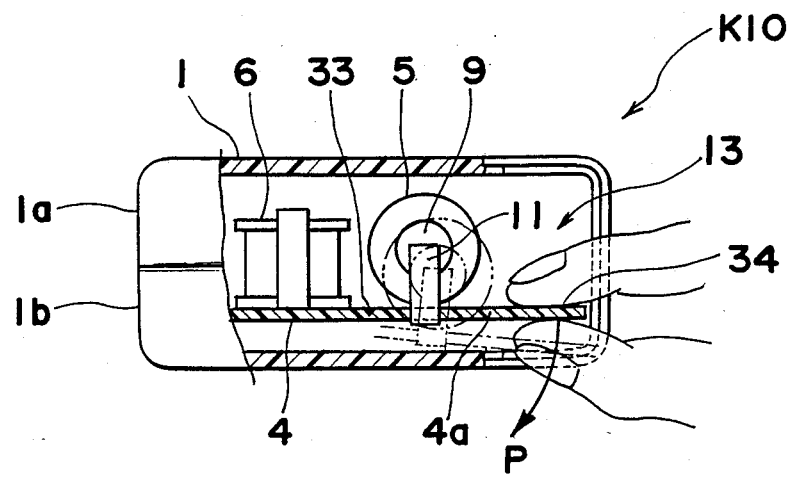
FIG. 27 is a transverse sectional view of a rechargeable type small electric appliance according to a 10th embodiment of the present invention.
Figure 28:
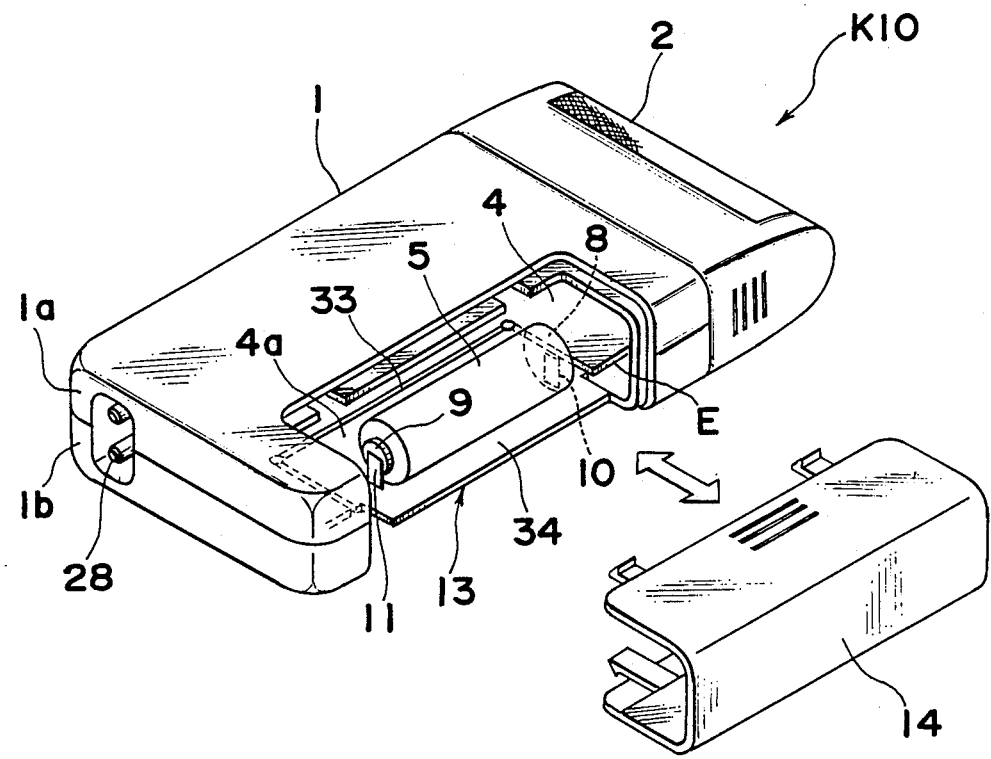
FIG. 28 is a perspective view showing a state in which a lid has been removed from the electric appliance of FIG. 27.

FIGS. 27 to 30 show a rechargeable type electric shaver K10 according to a 10th embodiment of the present invention. In FIG. 28, a pair of charging pins 28 are provided at the bottom portion of the casing 1. The battery outlet 13 is formed at a portion of the casing 1 so as to open at the front face, one side face and the rear face of the casing 1. The lid 14 has an U-shaped cross section and is detachably mounted on the battery outlet 13. A snap line 33 is formed on the wiring board 4 at a location surrounding the rechargeable battery 5, namely at a region 4a including a portion confronting the rechargeable battery 5 and peripheral portions of the joints between the negative terminal 8 and the lead piece 10 and between the positive terminal 9 and the lead piece 11. Since the region 4a of the wiring board 4 is snapped off from the wiring board 4 along the snap line 33, the rechargeable battery 5 can be completely removed from the wiring board 4 together with the joint portions with the lead pieces 10 and 11. Meanwhile, since a holder portion 34 projecting laterally outwardly from a side edge E of the wiring board 4 is formed at the region 4a which can be snapped off from the wiring board 4, the region 4a can be easily snapped off from the wiring board 4 by gripping the holder portion 34.

Figure 29:
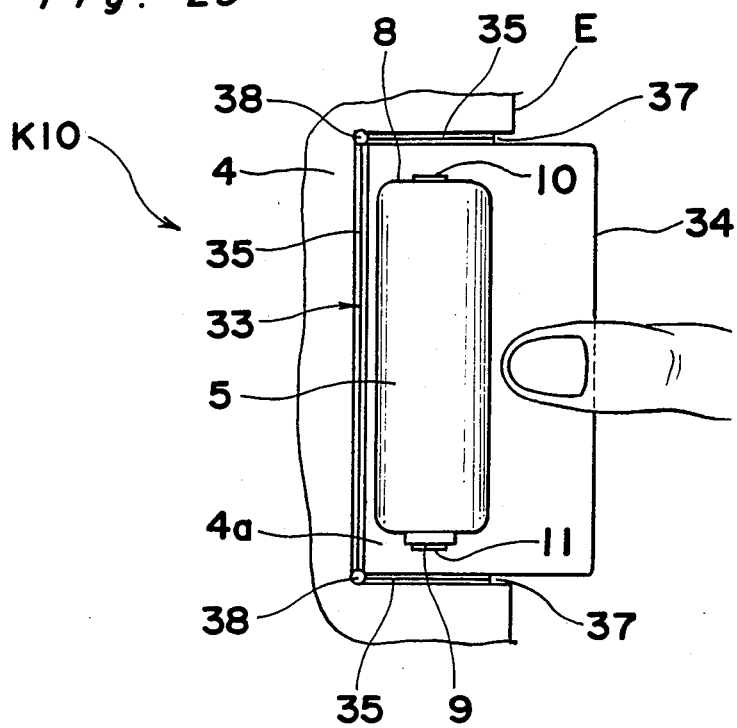
FIG. 29 is a fragmentary top plan view of a wiring board employed in the electric appliance of FIG. 27.
Figure 30:
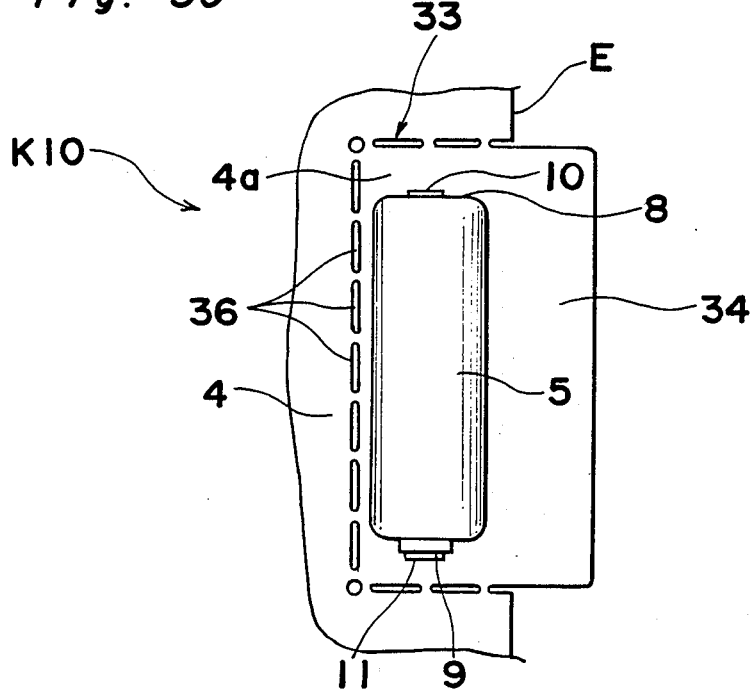
FIG. 30 is a view similar to FIG. 29, particularly showing a modification thereof.

The snap line 33 may be formed by a V-groove 35 as shown in FIGS. 27 and 29 or a series of elongated through-openings 36 or circular through-holes as shown in FIG. 30. If a pair of recesses 37 are, respectively, formed at opposite base portions of the holder portion 34 with respect to the wiring board 4 and a pair of pores 38 are, respectively, formed at two perpendicular corners of the V-groove 35 as shown in FIG. 29, the region 4a can be more easily snapped off from the wiring board 4 initially at the recesses 37 and then, along the snap line 33 by bending the holder portion 34 in the direction of the arrow P in FIG. 27 with a hand.

Figure 31:
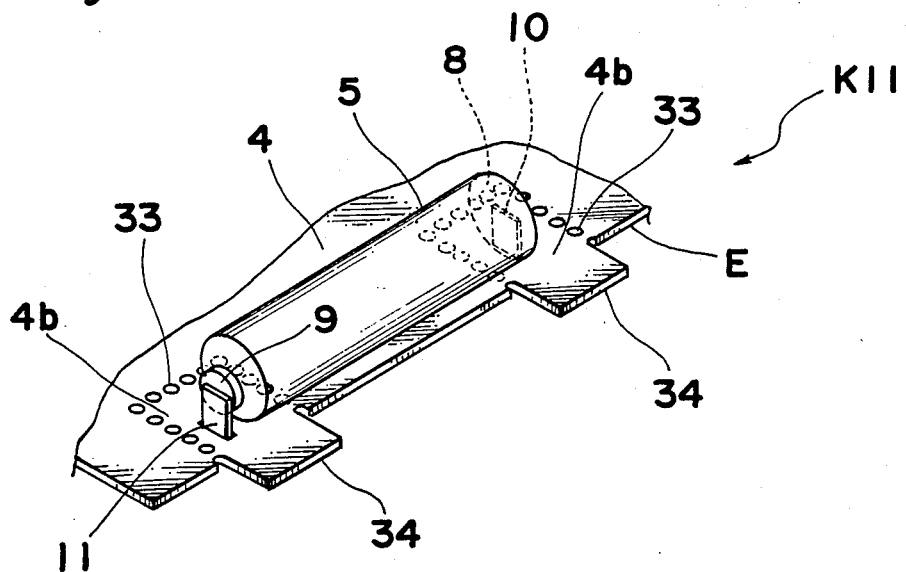
FIG. 31 is a fragmentary perspective view of a wiring board employed in a rechargeable type small electric appliance according to a 11th embodiment of the present invention.
Figure 32:
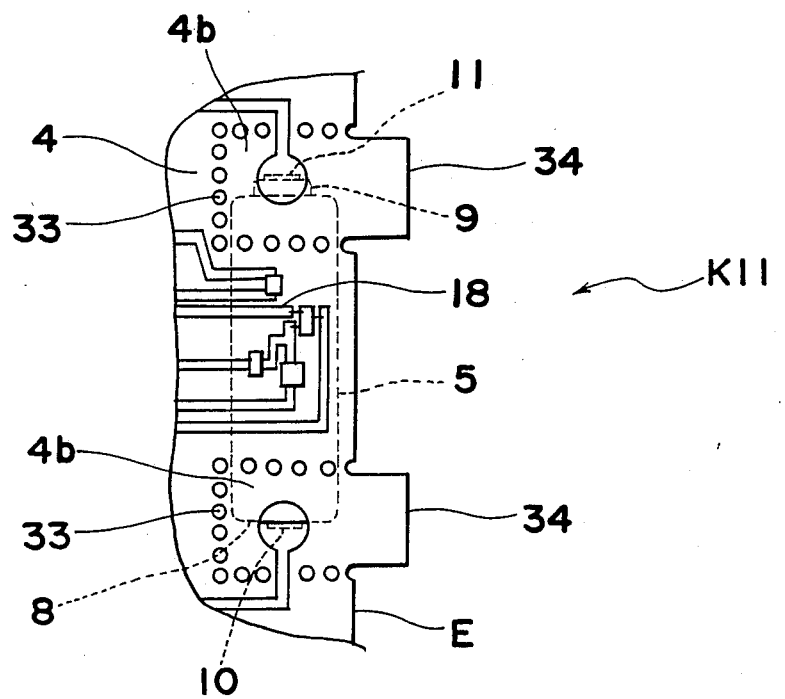
FIG. 32 is a fragmentary bottom plan view of the wiring board of FIG. 31.

FIGS. 31 and 32 show a rechargeable type electric shaver K11 according to an 11th embodiment of the present invention. The wiring board 4 has two peripheral portions 4b of the joints between the negative terminal 8 and the lead piece 10 and between the positive terminal 9 and the lead piece 11, respectively. In the electric shaver K11, the snap line 33 and the holder portion 34 are provided at each of the peripheral portions 4b such that the peripheral portion 4b of the joint between the negative terminal 8 and the lead piece 10 and the peripheral portion 4b of the joint between the positive terminal 9 and the lead piece 11 can be separately snapped off from the wiring board 4.

By this arrangement of the electric shaver K11, the rechargeable battery 5 can be removed from the wiring board 4 by directly snapping off the wiring board 4 with a hand in the same manner as the electric shaver K10. Furthermore, since the pattern 18 can be formed on even a portion of the wiring board 4 corresponding to the rechargeable battery 5 as shown in FIG. 32, the pattern 18 can be used effectively and the pattern 18 does not interfere with the rechargeable battery 5 at the time of removal of the rechargeable battery 5 from the wiring board 4.

Figure 33:
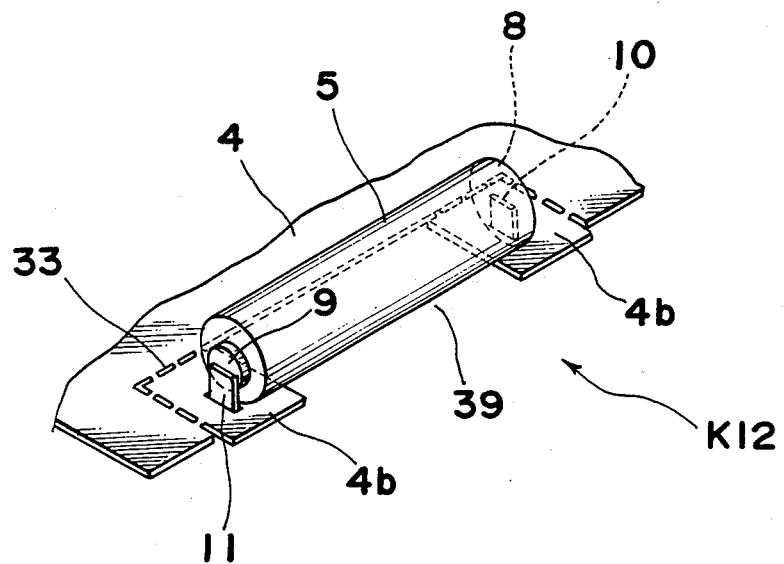
FIG. 33 is a view similar to FIG. 31, particularly showing a 12th embodiment of the present invention.
Figure 34:
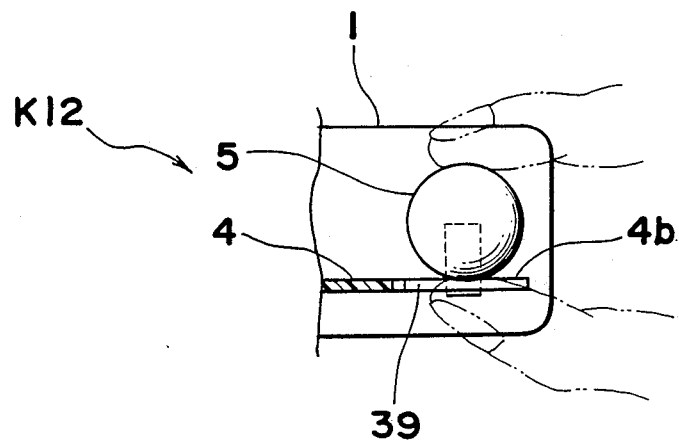
FIG. 34 is a fragmentary transverse sectional view of the wiring board of FIG. 33.

FIGS. 33 and 34 show a rechargeable type electric shaver K12 according to a 12th embodiment of the present invention. In the electric shaver K12, the snap line 33 is formed at each of the peripheral portions 4b of the joints between the negative terminal 8 and the lead piece 10 and between the positive terminal 9 and the lead piece 11 and a recessed portion 39 is formed between the peripheral portions 4b so as to confront the rechargeable battery 5.

By this arrangement of the electric shaver K12, the recessed portion 39 can be used as a space allowing insertion of a finger thereinto. Therefore, even in the narrow space in the casing 1, the peripheral portions 4b can be easily snapped off from the wiring board 4 by directly gripping the rechargeable battery 5 with fingers as shown in FIG. 34.

Figure 35:
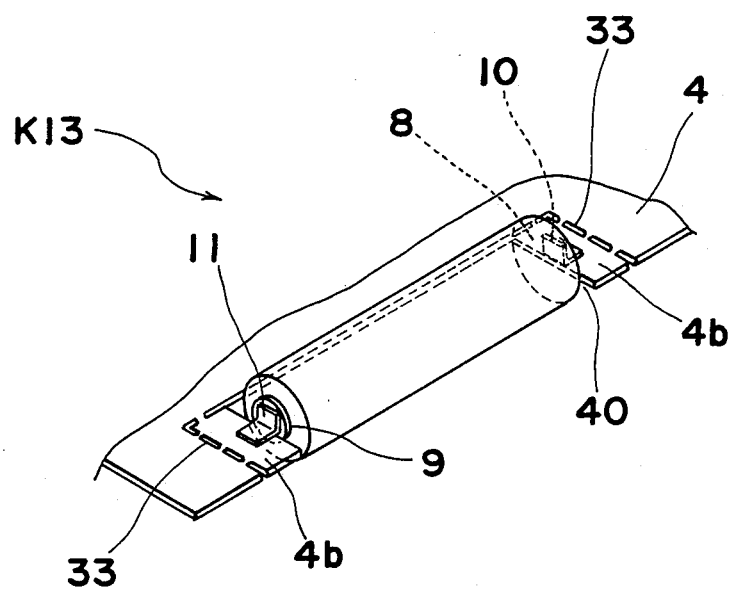
FIGS. 35 and 36 are views similar to FIGS. 33 and 34, respectively, particularly showing a 13th embodiment of the present invention.
Figure 36:
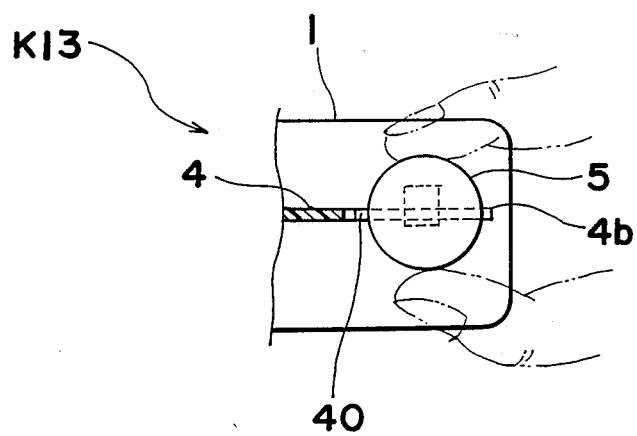

FIGS. 35 and 36 show a rechargeable type electric shaver K13 according to a 13th embodiment of the present invention. In the electric shaver K13, a recessed portion 40 is formed at the side edge E of the wiring board 4 and the rechargeable battery 5 is inserted into the recessed portion 40 such that upper and lower portions of the rechargeable battery 5 project from upper and lower faces of the wiring board 4, respectively. Meanwhile, the snap line 33 is formed at each of the peripheral portions 4b of the joints between the negative terminal 8 and the lead piece 10 and between the positive terminal 9 and the lead piece 11.

By this arrangement of the electric shaver K13, the peripheral portions 4b can be snapped off from the wiring board 4 by gripping the rechargeable battery 5 with fingers in the same manner as the electric shaver K12.

In the rechargeable type small electric appliance according to the 10th to 13th embodiments of the present invention, since at least the peripheral portions 4b of the wiring board 4 can be directly snapped off from the wiring board 4 with a hand without using a special tool, the rechargeable battery 5 can be easily collected from the electric appliance.

Figure 37:
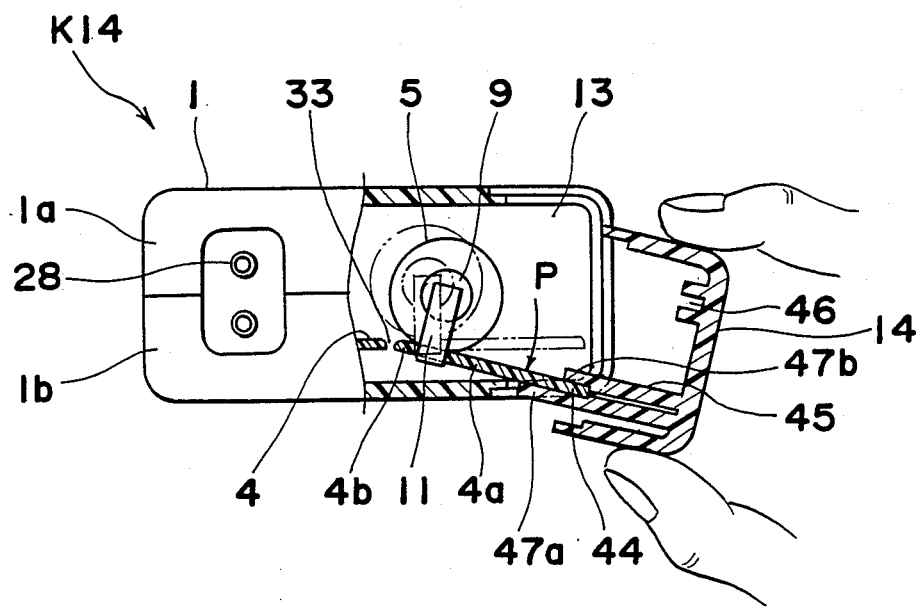
FIG. 37 is a partially sectional bottom plan view showing a state in which a wiring board is snapped off in a rechargeable type small electric appliance according to a 14th embodiment of the present invention.
Figure 39:
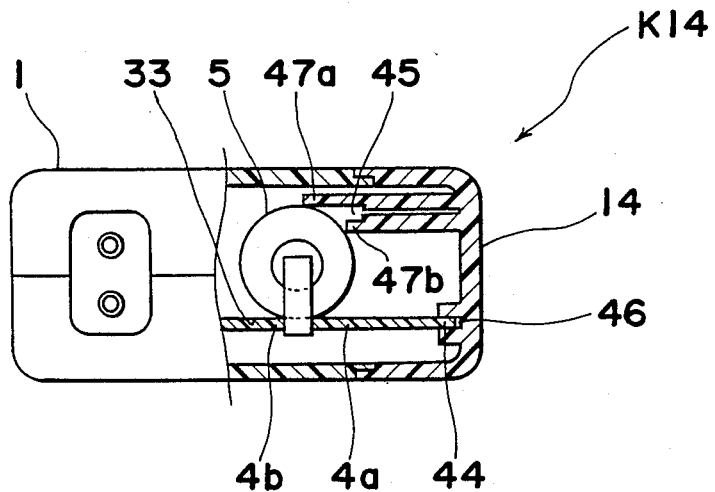
FIG. 39 is a partially sectional bottom plan view of the electric appliance of FIG. 37.

FIGS. 37 to 39 show a rechargeable type electric shaver K14 according to a 14th embodiment of the present invention. The electric shaver K14 is generally similar to the electric shaver K10. Namely, in the electric shaver K14, the snap line 33 is formed at the region 4a of the wiring board 4. In the electric shaver K14, the region 4a of the wiring board 4 is snapped off from the wiring board 4 along the snap line 33 by using the lid 14 as a tool. To this end, an inserting portion 44 is formed at a side edge of the region 4a and a receiving inlet 45 for receiving the inserting portion 44 is formed on the inner face of the lid 14. A support mouth 46 for supporting the wiring board 4 is further formed on the inner face of the wiring board 4. When the lid 14 has been mounted on the battery outlet 13, the inserting portion 44 of the wiring board 4 is fitted into the support mouth 46 such that the free side edge of the wiring board 4 is supported by the support mouth 46 as shown in FIG. 39. Meanwhile, when the lid 14 has been mounted on the battery outlet 13, the receiving inlet 45 is brought into contact with an upper peripheral portion of the rechargeable battery 5 as shown in FIG. 39 so as to eliminate play of the rechargeable battery 5.

The receiving inlet 45 is constituted by lips 47a and 47b. When the lid 14 is removed from the battery outlet 13 and then, is turned over, the lid 14 is positioned such that the inserting portion 14 is inserted between the lips 47a and 47b as shown in FIG. 39. In this case, if the lip 47a is so formed as to be longer than the lip 47b, not only the inserting portion 44 can be easily inserted between the lips 47a and 47b by applying the longer lip 47a to the underside of the inserting portion 44 but both of the lips 47a and 47b can be brought into contact with the peripheral surface of the rechargeable battery 5 so as to effectively eliminate play of the rechargeable battery 5.

In order to take the rechargeable battery 5 out of the casing 1, the lid 14 is removed from the casing 1 and then, is turned over such that the inserting portion 44 is inserted into the receiving inlet 45. Subsequently, when a bending force is applied to the lid 14 in the direction of the arrow P by holding the lid 14 with a hand, the region 4a of the wiring board 4 is snapped off from the wiring board 4 along the snap line 33 together with the rechargeable battery 5.

Figure 40:
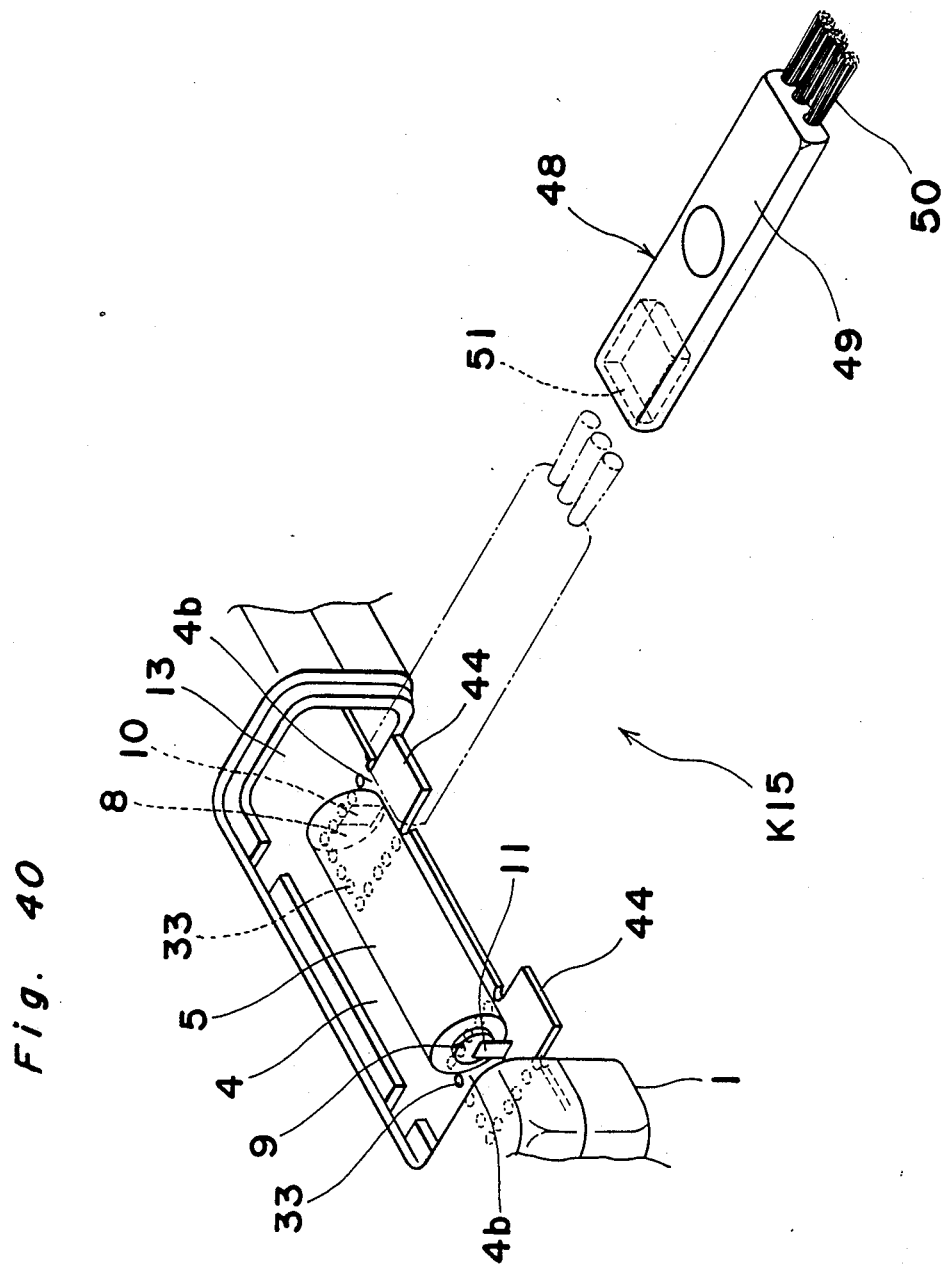
FIG. 40 is a fragmentary perspective view of a wiring board employed in a rechargeable type small electric appliance according to a 15th embodiment of the present invention.

FIG. 40 shows a rechargeable type electric shaver K15 according to a 15th embodiment of the present invention. The electric shaver K15 is generally similar to the electric shaver K11. Namely, in the electric shaver K15, the wiring board 1 has the two peripheral portions 4b of the joints between the negative terminal 8 and the lead piece 10 and between the positive terminal 9 and the lead piece 11. The snap line 33 and the inserting portion 44 are provided at each of the peripheral portions 4b. A cleaning brush 49 for cleaning the shaving blade unit 2 is provided as an accessory of the electric shaver K15 and has a shank 49. Bristles 50 are provided at one end of the shank 49. Meanwhile, an inlet 51 for detachably receiving the inserting portion 44 is formed at the other end of the shank 49. Thus, the inserting portion 44 is detachably inserted into the inlet 51 of the cleaning brush 48.

By the above described arrangement of the electric shaver K15, the inserting portion 44 of each of the peripheral portions 4b of the wiring board 4 is inserted into the inlet 51 of the cleaning brush 48 and the peripheral portions 4b of the wiring board 4 can be separately snapped off from the wiring board 4 by holding the cleaning brush 48. Thus, the rechargeable battery 5 can be removed from the wiring board 4.

Figure 41:
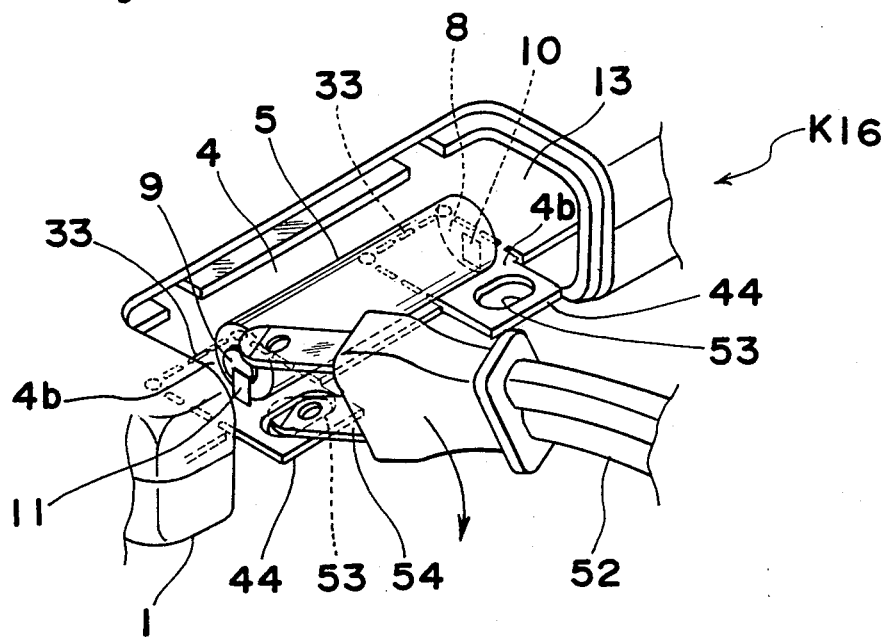
FIG. 41 is a view similar to FIG. 40, particularly showing a 16th embodiment of the present invention.

FIG. 41 shows a rechargeable type electric shaver K16 according to a 16th embodiment of the present invention. The electric shaver K16 is substantially the same as the electric shaver K15. The electric shaver K16 is different from the electric shaver K15 in that in the electric shaver K16, a power source cord 52 for charging the electric shaver K16 is used for snapping off the peripheral portions 4b of the wiring board 4 and that the inserting portion 44 of each of the peripheral portions 4b is formed with an opening 53 for receiving a distal end of each of a pair of plug blades 54 of the power source cord 52. In the electric shaver K16, the peripheral portions 4b can be separately snapped off from the wiring board 4 in the same manner as the electric shaver K15.

In the rechargeable type small electric appliance according to the 14th to 16th embodiments of the present invention, since at least the peripheral portions 4b of the wiring board 4 can be snapped off from the wiring board 4 and the inserting portion 44 is provided at each of the peripheral portions 4b, a portion of the wiring board 4 can be safely snapped off from the wiring board 4 by the use of the component or the accessory of the electric appliance without injury to fingers, so that the rechargeable battery 5 can be easily collected from the electric appliance.

Figure 45:
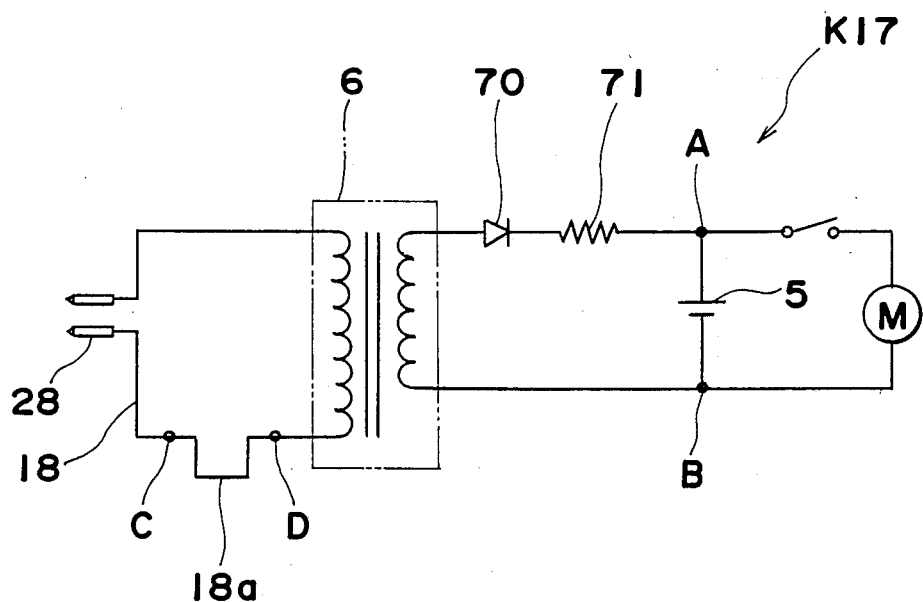
FIG. 45 is a circuit diagram of the electric appliance of FIG. 42.

FIGS. 42 to 45 show a rechargeable type electric appliance K17 according to a 17th embodiment of the present invention. In the electric shaver K17, a motor M for driving the shaving blade unit 2, the wiring board 4, etc. are accommodated in the casing 1. A battery support plate 65 for supporting the rechargeable battery 5 is molded integrally with the wiring board 4 such that the rechargeable battery 5 is mounted on the battery support plate 65. The snap line 33 constituted by a number of pores 66 or a groove is formed at the boundary between the battery support plate 65 and the wiring board 4. A grip portion 65a for facilitating direct grip of the battery support plate 65 is formed on the battery support plate 65 so as to project laterally outwardly from the side edge E of the wiring board 4. The pattern 18 corresponding to a circuit shown in FIG. 45 is formed on the wiring board 4 and the transformer 6, a diode 70, a resistor 71, etc. are mounted on the wiring board 4. The pattern 18 has a portion 18a of an AC 100 V line and the portion 18a of the AC 100 V line is formed on the battery support plate 65. The battery outlet 13 opens at one side face and one of the front and rear faces of the casing 1 such that the lid 14 having an L-shaped cross section is detachably mounted on the battery outlet 13. At least the rechargeable battery 5 is so provided on the wiring board 4 as to confront the battery outlet 13.

Figure 42:
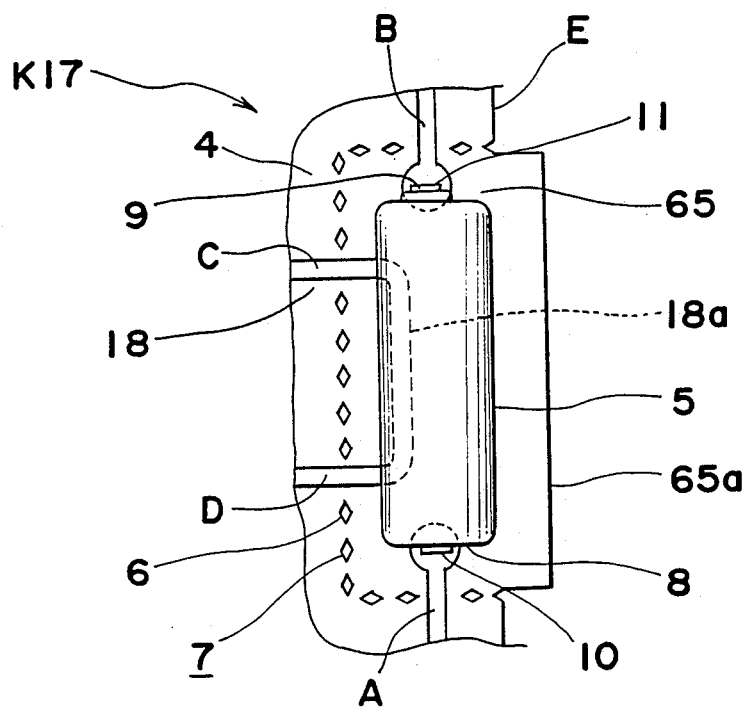
FIG. 42 is a fragmentary top plan view of a wiring board employed in a rechargeable type small electric appliance according to a 17th embodiment of the present invention.
Figure 43:
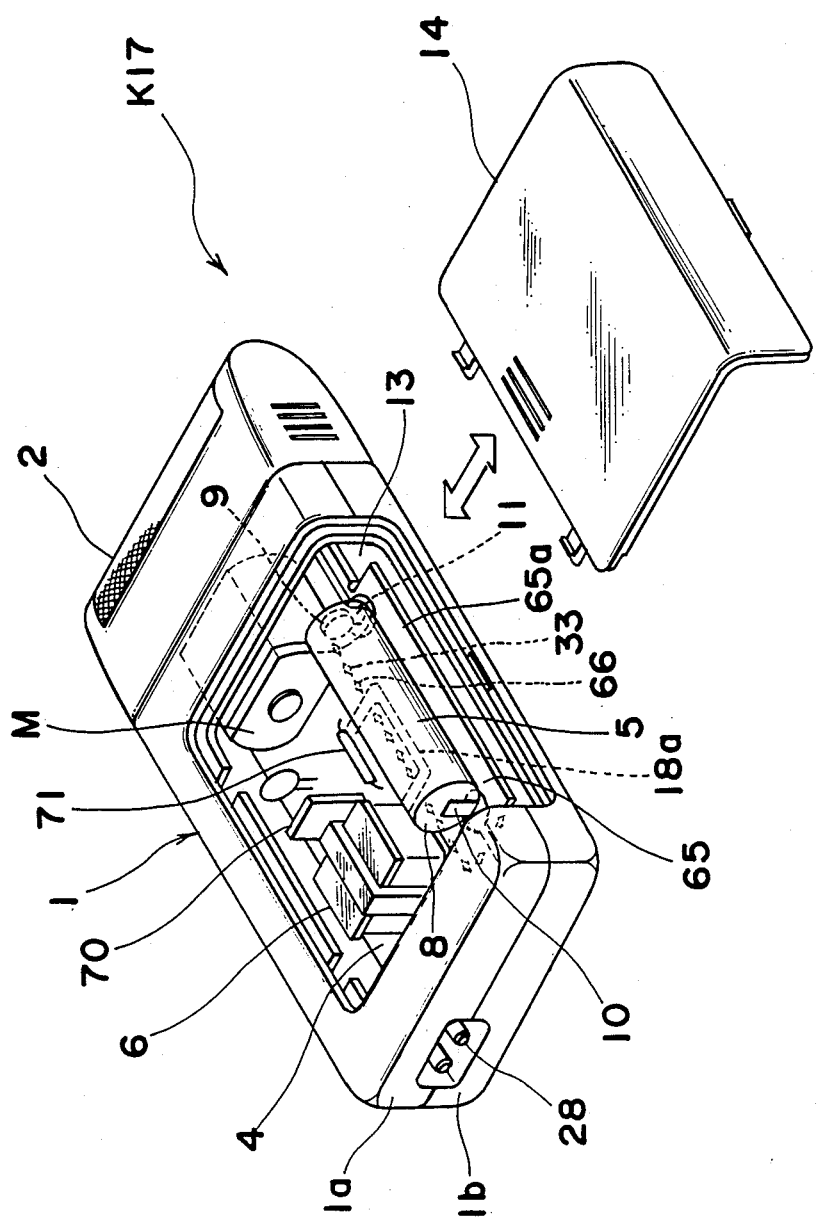
FIG. 43 is a perspective view showing a state in which a lid has been removed from the electric appliance of FIG. 42.
Figure 44:
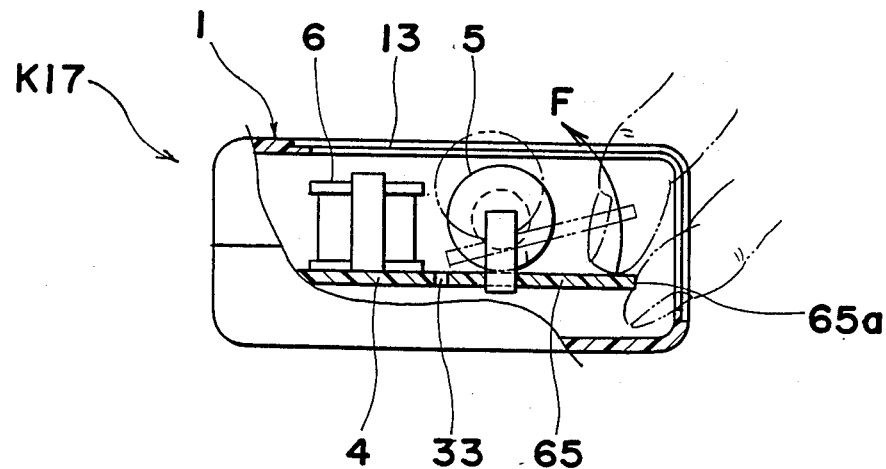
FIG. 44 is a transverse sectional view showing a state in which a battery support plate is snapped off in the electric appliance of FIG. 42.

In order to take the rechargeable battery 5 out of the casing 1, the lid 14 is initially removed from the casing 1 so as to open the battery outlet 13. Subsequently, when a bending force is applied to the battery support plate 65 in the direction of the arrow F in FIG. 44 by directly gripping the grip portion 65a of the battery support plate 65 with a hand, the battery support plate 65 can be snapped off from the wiring board 4 along the snap line 33. By snapping off the battery support plate 65 from the wiring board 4, portions A and B of a charging line of the pattern 18 shown in FIGS. 42 and 45 are cut off and the rechargeable battery 5 can be removed from the wiring board 4 together with the battery support plate 65. At the same time, portions C and D of the AC 100 V line of the pattern 18 shown in FIGS. 42 and 45 are cut off and thus, the portion 18a of the AC 100 V line can be removed from the AC 100 V line. Therefore, the rechargeable battery 5 is taken out of the battery outlet 13 so as to be collected for its safe disposal. Meanwhile, even if the electric shaver K17 is charged inadvertently after the rechargeable battery 5 has been removed from the wiring board 4, electric current does not flow to the motor M, so that safe charging of the electric shaver K17 is ensured.

Figure 46:
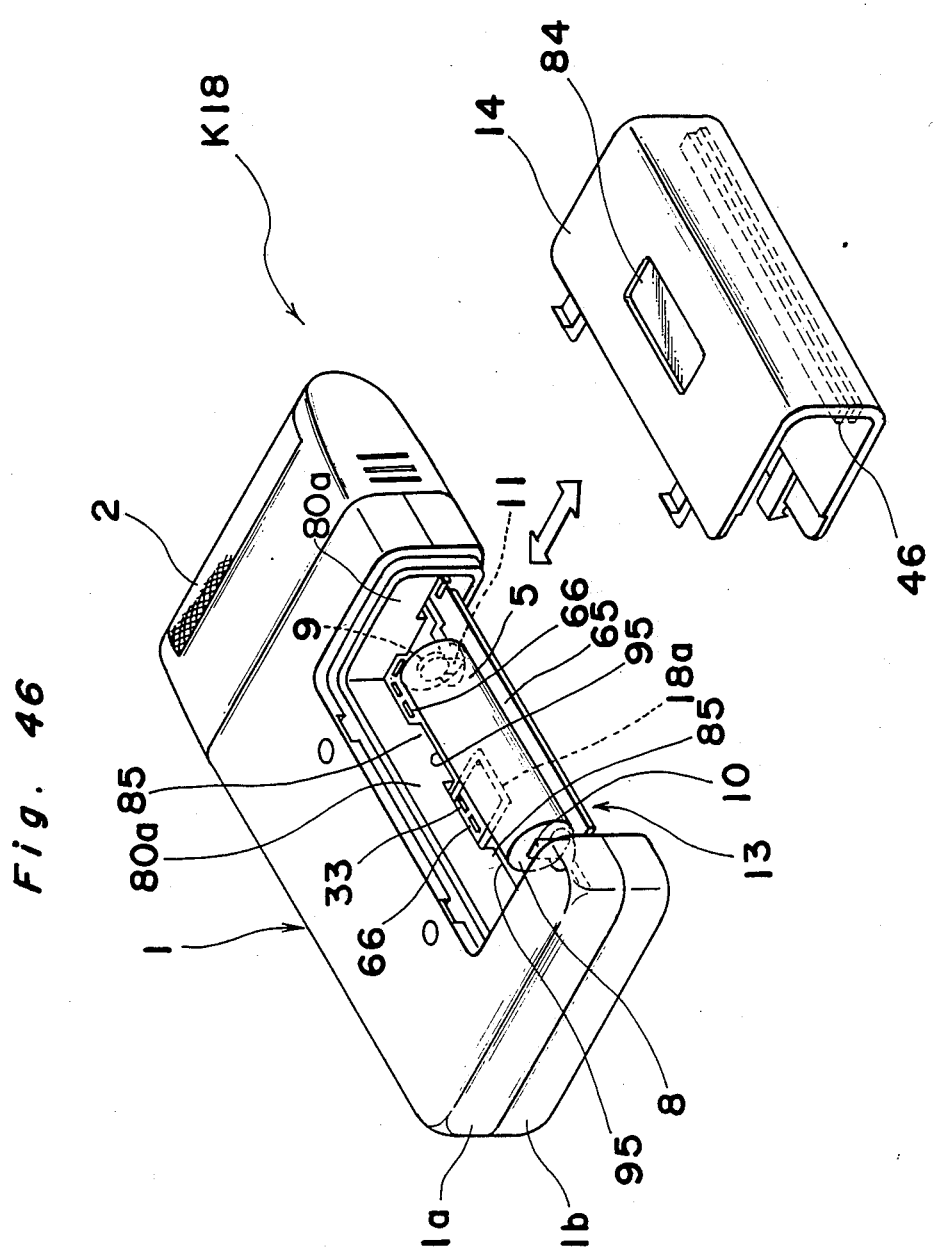
FIG. 46 is a view similar to FIG. 43, particularly showing an 18th embodiment of the present invention.
Figure 47:
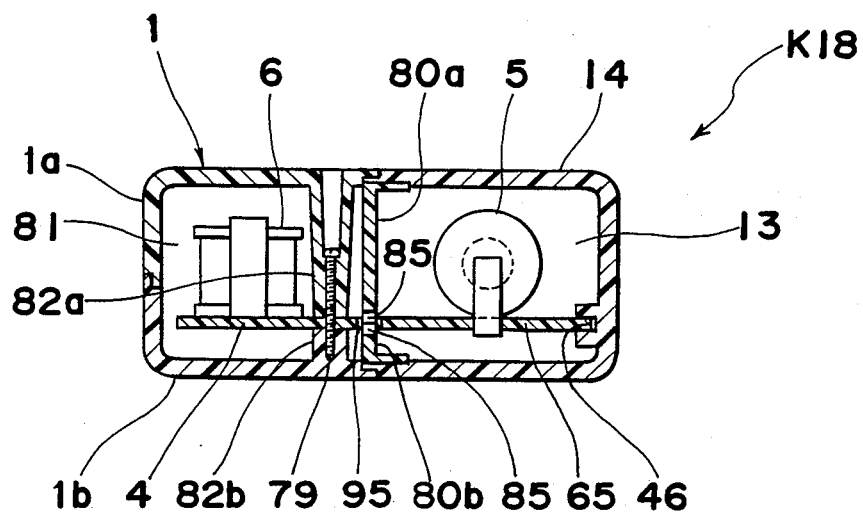
FIG. 47 is a transverse sectional view showing a state in which a lid has been mounted on the electric appliance of FIG. 46.
Figure 48:
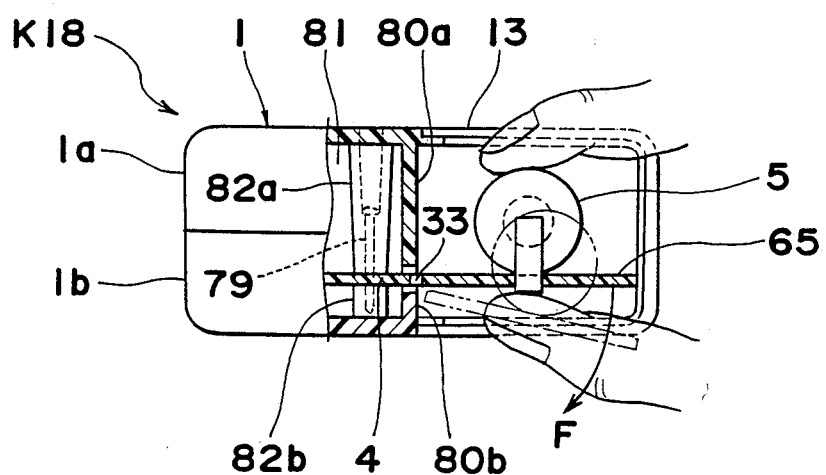
FIG. 48 is a transverse sectional view showing a state in which the lid has been removed from the electric appliance of FIG. 46.

FIGS. 46 to 48 show a rechargeable type electric shaver K18 according to an 18th embodiment of the present invention. In the electric shaver K18, the front and rear casings 1a and 1b are butted against each other and are integrally coupled with each other by screws 79. The battery outlet 13 opens at one side face, the front face and the rear face of the casing 1 such that the lid 14 having an U-shaped cross section is detachably mounted on the battery outlet 13. In the electric shaver K18, the battery support plate 65 is detachably coupled, through the snap line 33, with the wiring board 4 accommodated in the casing 1 in the same manner as the electric shaver K17. Furthermore, in the electric shaver K18, the wiring board 4 is accommodated in the casing 1 such that only the battery support plate 65 confronts the battery outlet 13. Partition walls 80a and 80b project from inner faces of the front and rear casings 1a and 1b, respectively. By butting the partition walls 80a and 80b against each other, interior of the casing 1 is divided into a high voltage chamber 81 for AC 100 to 240 V and the battery outlet 13. The high voltage chamber 81 incorporates the transformer 6, etc. on the wiring board 4. Each of the partition walls 80a and 80b has several teeth 85 such that the teeth 85 of the partition walls 80a and 80b are inserted into thin elongated openings 95 each formed between the pores 66. The screws 79 for coupling the front and rear casing 1a and 1b are screwed into bosses 82a and 82b formed on the front and rear casings 1a and 1b in close vicinity to the partition walls 80a and 80b, respectively.

As shown in FIG. 47, the support mouth 46 for receiving the side edge of the battery support plate 65 when the lid 14 has been mounted on the battery outlet 13 is formed on the inner face of the lid 14. Thus, the free side edge of the battery support plate 65 is fitted into the support mouth 46 so as to be supported by the support mouth 46. As shown in FIG. 46, an window 84 is formed on the lid 14 such that whether or not the rechargeable battery 5 is being accommodated in the casing 1 is checked through the window 84.

By this arrangement of the electric shaver K18, when the lid 14 is removed from the battery outlet 13 and then, the battery support plate 65 is snapped off from the wiring board 4 by holding the battery support plate 65 and the rechargeable battery 5 with a hand, the rechargeable battery 5 can be taken out of the casing 1 and the portion 18a of the AC 100 V line of the pattern 18 can be removed from the pattern 18 on the wiring board 4. At this time, since a portion of the wiring board 4 corresponding to the snap line 33 is depressed between the partition walls 80a and 80b, the battery support plate 65 can be easily snapped off from the wiring board 4. At this time, a clamping force of the screws 79 is large enough to sufficiently resist the bending force of the battery support plate 65 so as to prevent the partition walls 80a and 80b from deviating from each other. Meanwhile, since the battery outlet 13 is isolated from the high voltage chamber 81 by the partition walls 80a and 80b, such an accident does not take place that the operator receives an electric shock inadvertently, thereby resulting in safe charging of the electric shaver K18.

Figure 49:
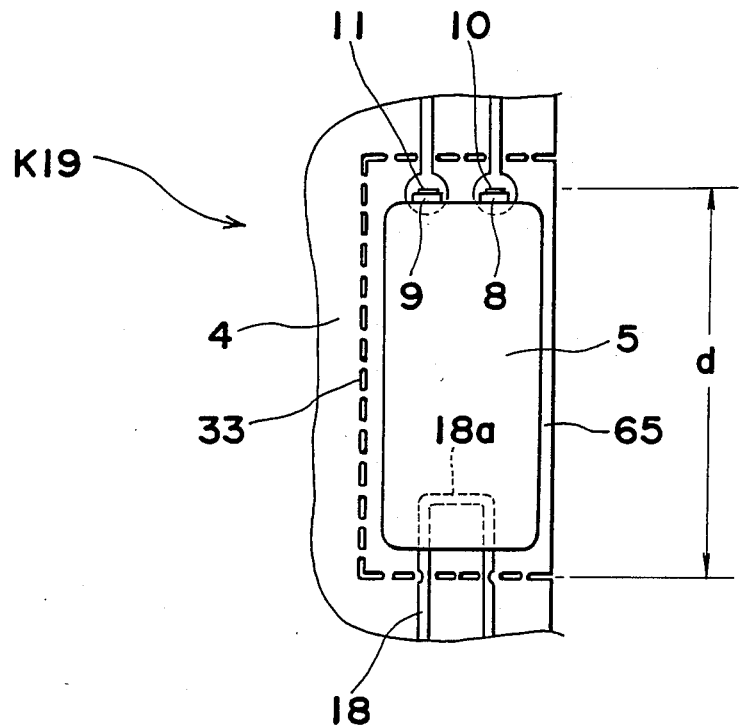
FIG. 49 is a view similar to FIG. 42, particularly showing a 19th embodiment of the present invention.

FIG. 49 shows a rechargeable type electric shaver K19 according to a 19th embodiment of the present invention. In the electric shaver K19, a rectangular battery having the negative and positive terminals 8 and 9 arranged on only one end thereof is employed as the rechargeable battery 5. The portion 18a of the AC 100 V line of the pattern 18 is formed on the battery support plate 65. At this time, the AC 100 V line and the charging line of the pattern 18 are spaced a large distance d from each other.

Figure 50:
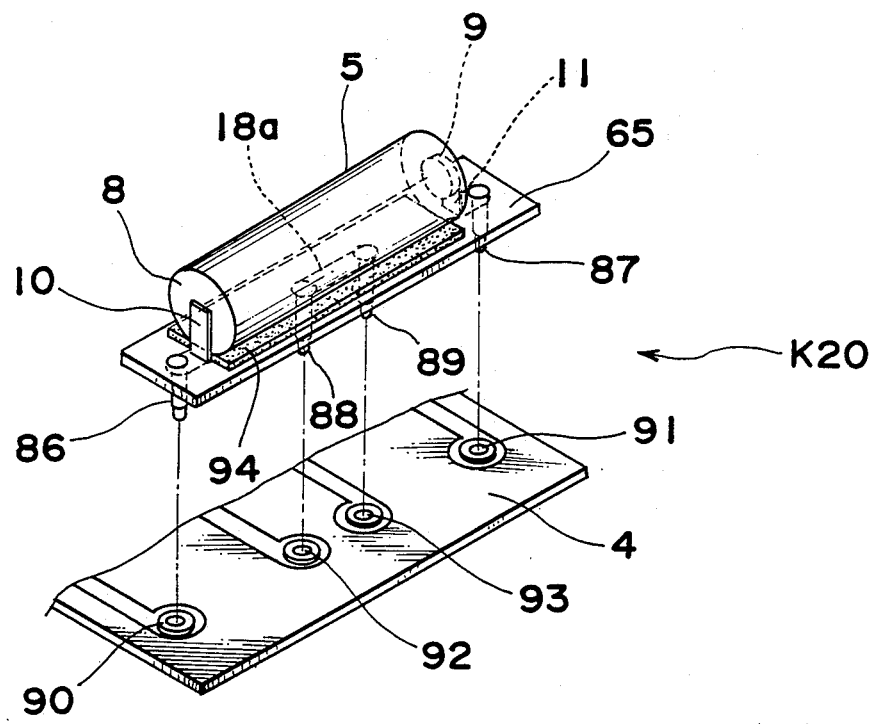
FIG. 50 is a perspective view showing a state in which a battery support plate and a wiring board are separated from each other in a rechargeable type small electric appliance according to a 20th embodiment of the present invention.
Figure 51:
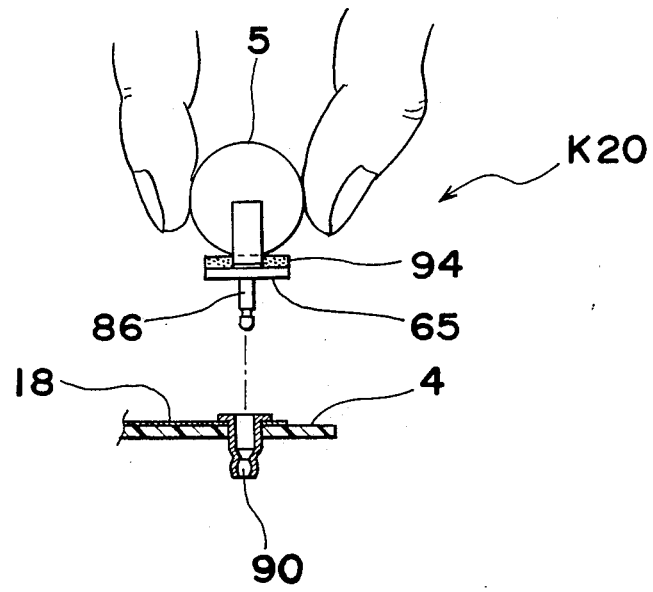
FIG. 51 is a partially sectional side elevational view showing the battery support plate and the wiring board of FIG. 50.

FIGS. 50 and 51 show a rechargeable type electric shaver K20 according to a 20th embodiment of the present invention. In the electric shaver K20, the battery support plate 65 is provided separately from the wiring board 4. The rechargeable battery 5 is mounted on an upper face of the battery support plate 65 by soldering, etc. the negative and positive terminals 8 and 9 respectively to the lead pieces 10 and 11 projecting from the battery support plate 65. Pins 86 and 87 connected to the lead pieces 10 and 11, respectively project from a lower face of the battery support plate 65. The portion 18a of an input circuit of the pattern 18 formed on the wiring board 4 is formed on the battery support plate 65 and pins 88 and 89 connected to the portion 18a are provided between and in alignment with the pins 86 and 87 so as to project from the lower face of the battery support plate 65. On the other hand, jacks 90, 91, 92 and 93 are provided on the wiring board 4 such that the pins 86, 87, 88 and 89 are, respectively, smoothly fitted into the jacks 90, 91, 92 and 93 without increase of contact resistance of the pins 86 to 89.

Thus, when the battery support plate 65 is mounted on the wiring board 4 by fitting the pins 86 to 89 into the jacks 90 to 93, respectively. In order to remove the rechargeable battery 5 from the wiring board 4 and remove the portion 18a of the pattern 18a from the pattern 18, the pins 86 to 89 are drawn from the jacks 90 to 93, respectively by holding the rechargeable battery 5 and the battery support plate 65 with a hand as shown in FIG. 51. At this time, it is desirable that the pins 88 and 89 should be provided at a widthwise central position of the battery support plate 65 such that a finger holding the battery support plate 65 is not brought into contact with the pins 88 and 89 when the battery support plate 65 is removed from the wiring board 4. Meanwhile, it is desirable that an elastic insulating sheet 94 be provided between the rechargeable battery 5 and the battery support plate 65.

Figure 52:
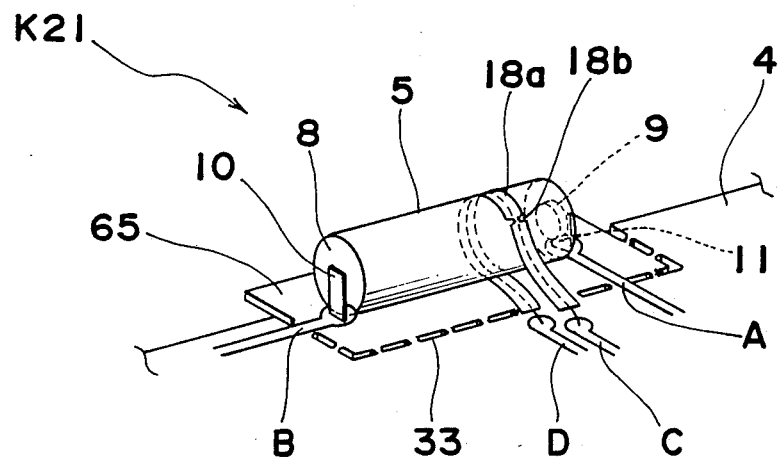
FIG. 52 is a fragmentary perspective view of a wiring board employed in a rechargeable type small electric appliance according to a 21st embodiment of the present invention.

FIG. 52 shows a rechargeable type electric shaver K21 according to a 21st embodiment of the present invention. In the electric shaver K21, a lead wire type member connected to the wiring board 4 is employed as the portion 18a of the pattern 18. The lead wire type portion 18a is attached to a portion of the battery support plate 65, for example, wound around the rechargeable battery 5. In this case, the portions C and D of the pattern 18 are directly cut off. Alternatively, a weak portion 18b constituted by perforations is formed in the course of the portion 18a of the pattern 18 such that the portion 18a is cut off at the weak portion 18b. It goes without saying that the portion 18a itself of the pattern 18 may be formed by a weak member such as a foil.

In the rechargeable type small electric appliance according to the 17th to 21st embodiments of the present invention, since the rechargeable battery 5 is coupled with the battery support plate 65 mounted detachably on the wiring board 4, the rechargeable battery 5 can be easily removed from the wiring board 4 by detaching the battery support plate 65 from the wiring board 4 and thus, can be easily collected for its safe disposal. Furthermore, the portion 18a of the input circuit of the pattern 18 formed on the wiring board 4 is formed on the battery support plate 65. Thus, when the battery support plate 65 is removed from the wiring board 4 together with the rechargeable battery 5, the portion 18a of the pattern 18 can also be removed from the pattern 18. Thus, even if the electric appliance is charged inadvertently after the rechargeable battery 5 has been removed from the wiring board 4, electric current does not flow to the motor M, thereby resulting in safe charging of the electric appliance.

Figure 53:
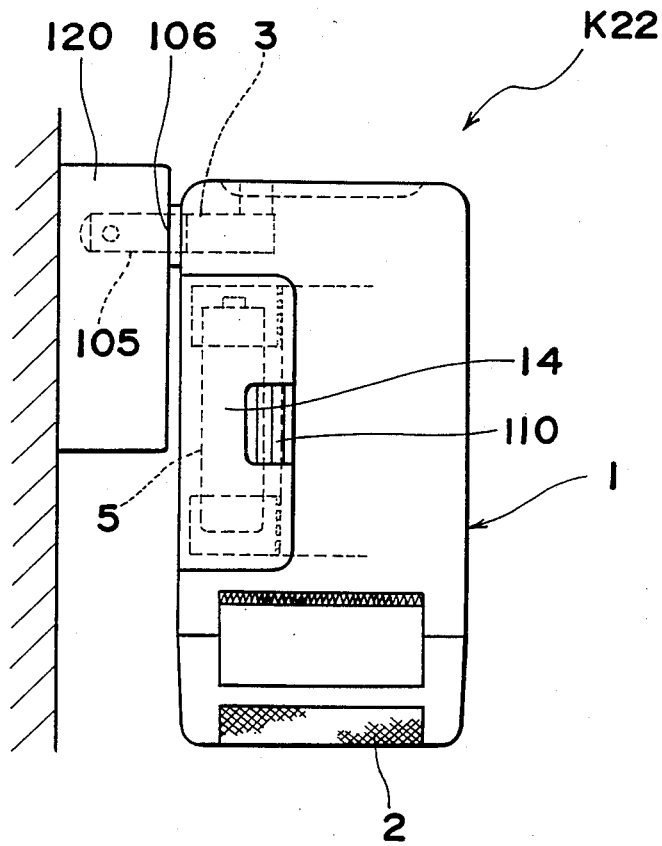
FIG. 53 is a side elevational view showing a chargeable state of a rechargeable type small electric appliance according to a 22nd embodiment of the present invention.
Figure 55:
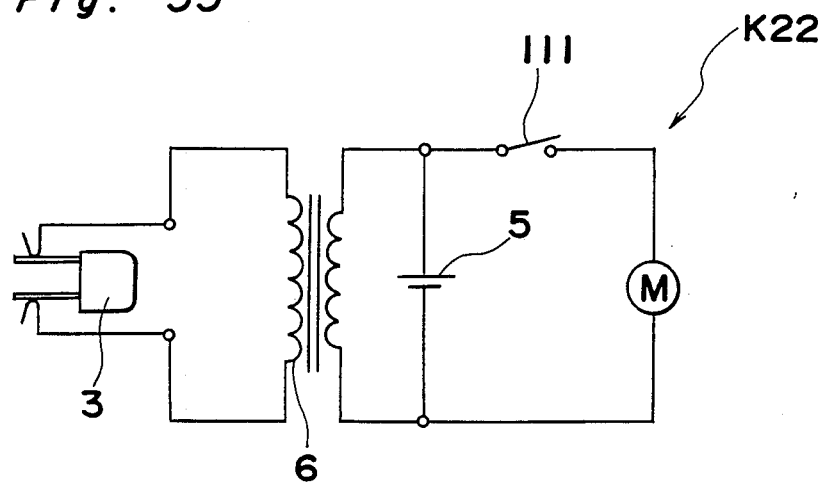
FIG. 55 is a circuit diagram of the electric appliance of FIG. 53.
Figure 54:
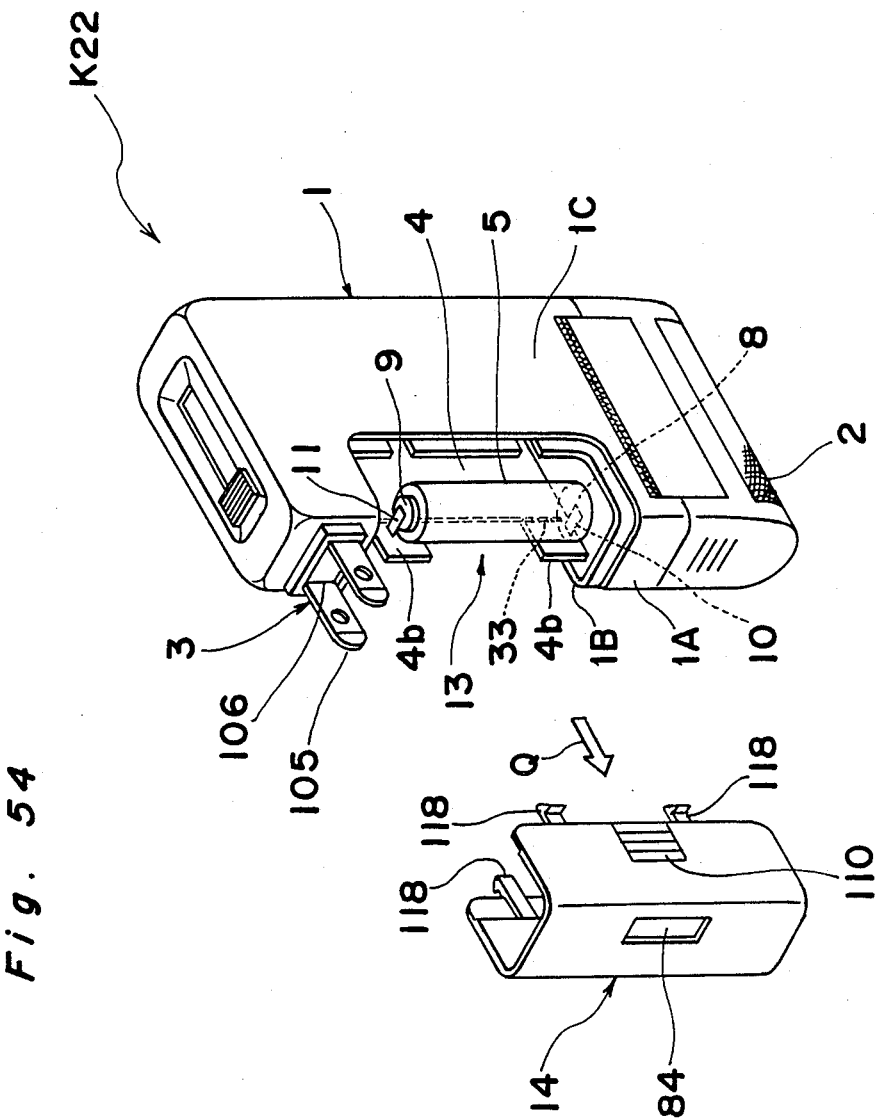
FIG. 54 is a perspective view showing a state in which a lid has been removed from the electric appliance of FIG. 53.

FIGS. 53 to 55 show a rechargeable type electric shaver K22 according to a 22nd embodiment of the present invention. The shaving blade unit 2 is provided at the upper portion of the casing 1, while the charging plug 3 is provided at the bottom portion of the casing 1. The charging plug 3 has a pair of retractable plug blades 105. The plug blades 105 retractably project from a pair of slits 106 formed on the side face 1A of the casing 1, respectively. In the vicinity of the slits 106, the battery outlet 13 opens at the side face 1A, the front face 1B and a rear face 1C. The pattern 18 corresponding to a circuit shown in FIG. 55 is formed on the wiring board 4. Furthermore, the rechargeable battery 5, the transformer 6, a switch 111, etc. are mounted on the wiring board 4. At least the rechargeable battery 5 is so provided on the wiring board 4 as to confront the battery outlet 13.

The rechargeable battery 5 is detachably mounted on the wiring board 4. For example, the peripheral portions 4b of the joints between the negative terminal 8 and the lead piece 10 and between the positive terminal 9 and the lead piece 11 are snapped off from the wiring board 4 along the snap line 33. The lid 14 having an U-shaped cross section is detachably mounted on the battery outlet 13 so as to be opened in the direction of the arrow Q identical with the direction of projection of the plug blades 105. The lid 14 has a nonslip portion 110 for preventing slip of a finger and a predetermined number of engageable claws 118 capable of elastic deformation. Through utilization of elasticity, the engageable claws 118 are detachably engageable with a mouth edge of the battery outlet 13 of the casing 1. The engageable claws 118 are brought into engagement with the mouth edge of the battery outlet 13 such that the battery outlet 13 is kept closed by the lid 14. Meanwhile, when the lid 14 is pulled in the direction of the arrow Q by gripping the nonslip portion 110 with a hand, the engageable claws 118 are disengaged from the mouth edge of the battery outlet 13 and thus, the lid 14 is removed from the casing 1. Meanwhile, the window 84 is provided on the lid 14 so as to enable the operator to visually inspect presence of the rechargeable battery 5 from outside of the lid 14.

When the electric shaver K22 is charged, the plug blades 105 are projected as shown in FIG. 53 and are inserted into a socket outlet 120 on a wall or a socket outlet provided at one end of a power source cord. In this charging state, the socket outlet 120 is disposed adjacent to the lid 14 in the direction of the arrow Q for opening the lid 14 and thus, the socket outlet 120 prevents the lid 14 from being removed from the casing 1. Therefore, the rechargeable battery 5 is not removed from the wiring board 4 inadvertently at the time of charging of the electric shaver K22, thereby resulting in safe charging of the electric shaver K22. On the contrary, when the electric shaver K22 is not being charged, the lid 14 can be removed from the casing 1, so that the rechargeable battery 5 can be removed from the wiring board 4 by snapping off the peripheral portions 4b from the wiring board 4.

The plug blades 105 of the charging plug 3 are retractably displaced by sliding a knob of the charging plug 3 in the direction of the arrow Q and in the direction opposite to the direction of the arrow Q but may also be retractably displaced through their rotational operation.

Figure 56:
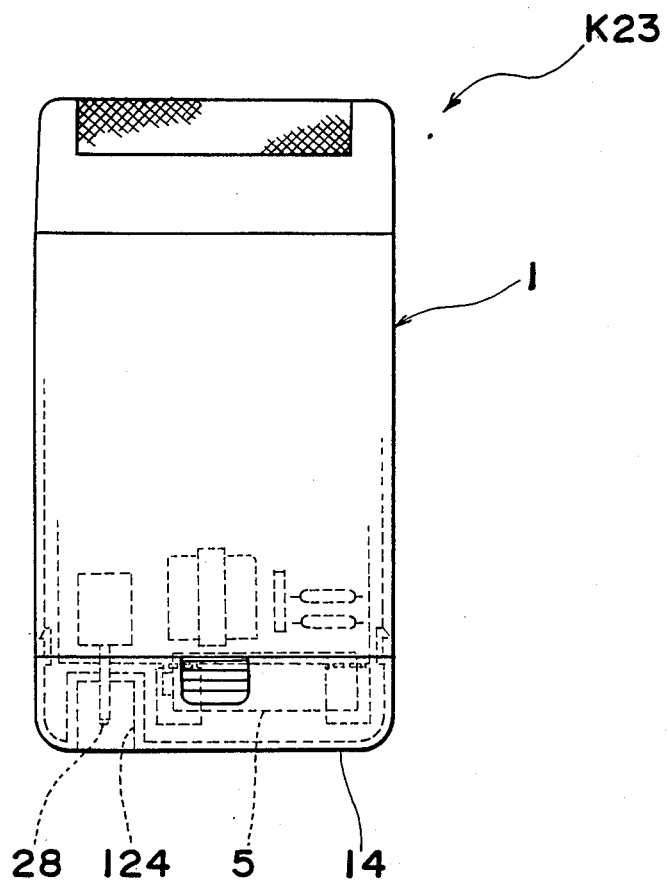
FIG. 56 is a front elevational view of a rechargeable type small electric appliance according to a 23rd embodiment of the present invention.
Figure 57:
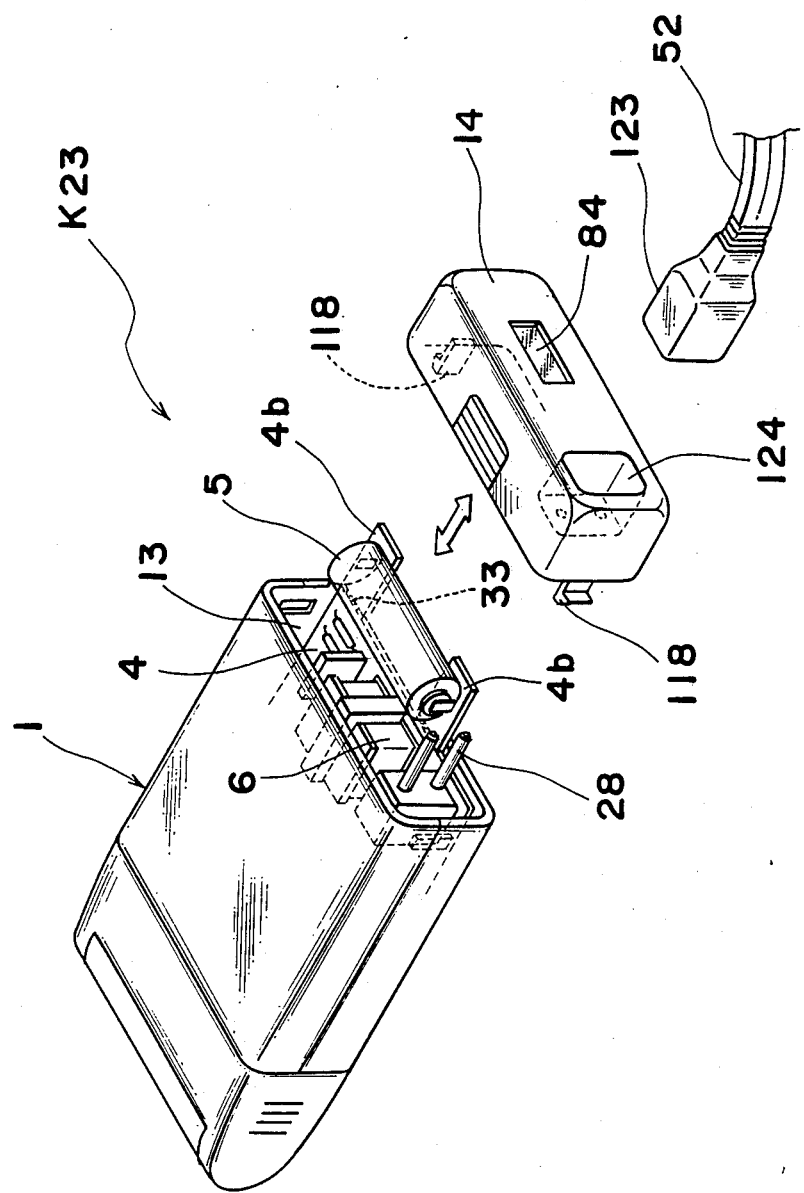
FIG. 57 is a perspective view showing a state in which a lid has been removed from the electric appliance of FIG. 56.

FIGS. 56 and 57 show a rechargeable type electric shaver K23 according to a 23rd embodiment of the present invention. In the electric shaver K23 the battery outlet 13 is provided at the bottom of the casing 1. The peripheral portions 4b project from the wiring board 4 towards the battery outlet 13 so as to be snapped off from the wiring board 4 and the rechargeable battery 5 is mounted on the peripheral portions 4b. Meanwhile, the charging pins 28 mounted on the wiring board 4 project towards the battery outlet 13. The lid 14 is detachably mounted on the battery outlet 13. The lid 14 has a plug inlet 124 for receiving a plug 123 of the power source cord 52 and the window 84 for visually inspecting presence of the rechargeable battery 5. Furthermore, the engageable claws 118 capable of elastic deformation are provided on the lid 14 and are detachably engaged with the mouth edge of the battery outlet 13 such that the battery outlet 13 is kept closed by the lid 14. When the battery outlet 13 is being closed by the lid 14, the charging pins 28 are projected into the plug inlet 124.

By the above described arrangement of the electric shaver K23, when the plug 123 of the power source cord 52 is inserted into the plug inlet 124, the charging pins 28 are fitted into the plug 123 and thus, the plug 123 prevents the lid 14 from being removed from the casing 1. Hence, at this time, the rechargeable battery 5 cannot be removed from the wiring board 4, so that there is not such a possibility that the operator receives an electric shock.

On the other hand, when the plug 123 has been drawn from the plug inlet 124, the lid 14 can be removed from the casing 1 and thus, the rechargeable battery 5 can be removed from the wiring board 4.

Figure 58:
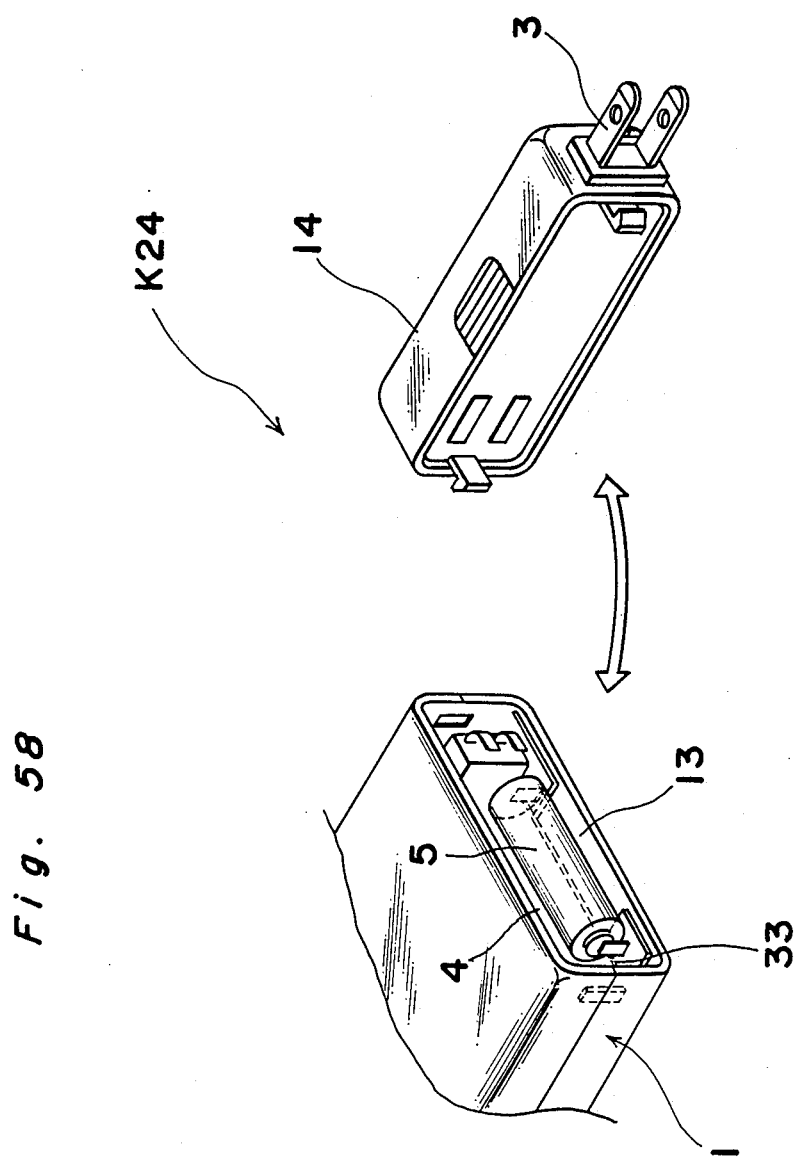
FIGS. 58 and 59 are views similar to FIG. 57, particularly showing 24th and 25th embodiments of the present invention, respectively.

FIG. 58 shows a rechargeable type electric shaver K24 according to a 24th embodiment of the present invention. The electric shaver K24 is generally similar to the electric shaver K23. The electric shaver K24 is different from the electric shaver K23 in that in the electric shaver K24, the lid 14 is provided with the charging plug 3 having the retractable plug blades.

By this arrangement of the electric shaver K24, since the charging plug 3 is inserted into the socket outlet 120 at the time of charging of the electric shaver K24 in the same manner as the electric shaver K22, the lid 14 cannot be removed from the casing 1 and thus, the rechargeable battery is not removed from the wiring board 4 inadvertently.

On the contrary, when the electric shaver K24 is not being charged, the lid 14 can be removed from the casing 1 such that the rechargeable battery 14 can be removed from the wiring board 4.

Figure 59:
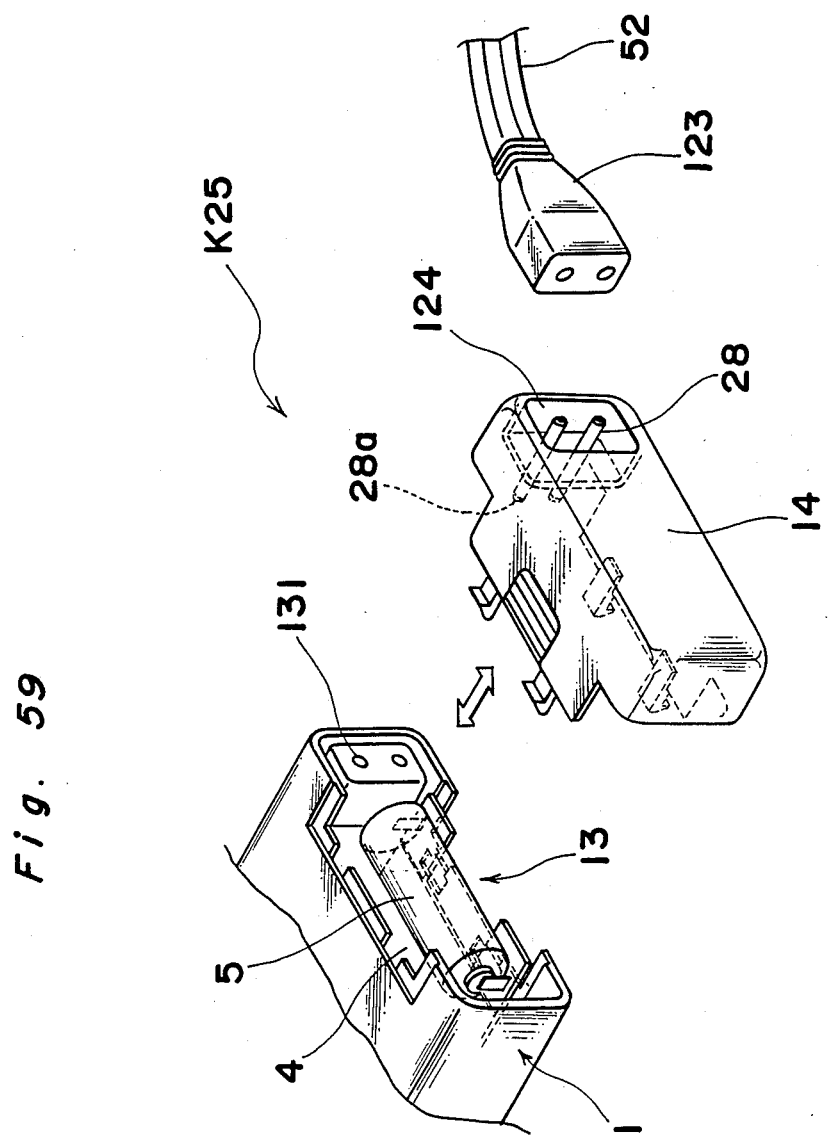

FIG. 59 shows a rechargeable type electric shaver K25 according to a 25th embodiment of the present invention. The electric shaver K25 is fundamentally the same as the electric shaver K23. In the electric shaver K23, the charging pins 28 are provided on the casing 1. On the other hand, in the electric shaver K25, the charging pins 28 are provided in the plug inlet 124 of the lid 14 such that one end of each of the charging pins 28 is inserted into each of pin holes 131 of the wiring board 4 when the lid 14 is mounted on the battery outlet 13.

Figure 60A:
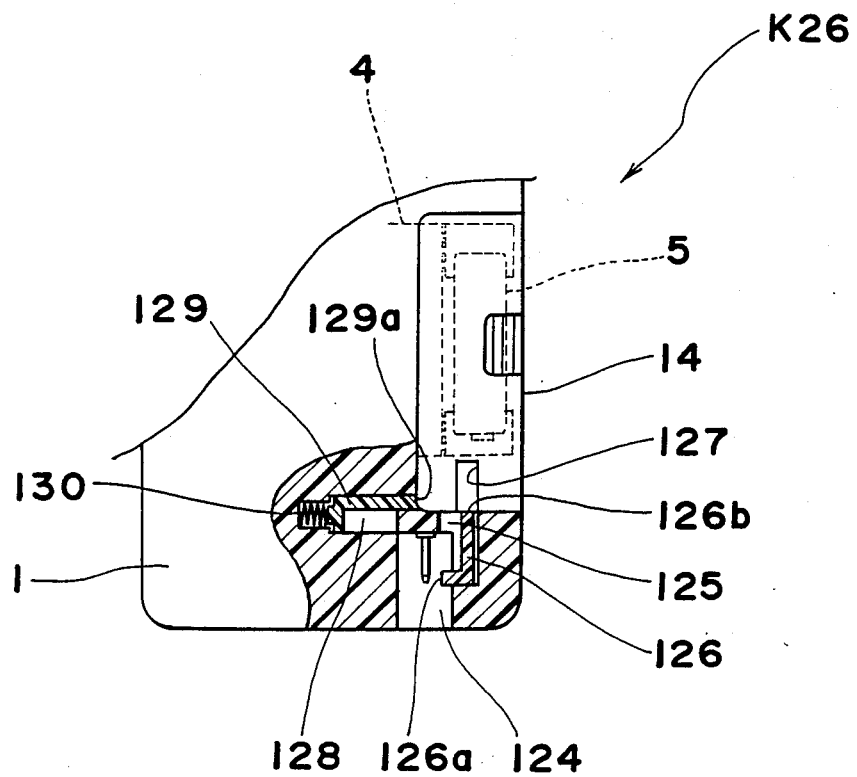
FIGS. 60a and 60b are fragmentary front elevational views showing a nonchargeable state and a chargeable state of a rechargeable type small electric appliance according to 26th embodiment of the present invention, respectively.
Figure 60B:
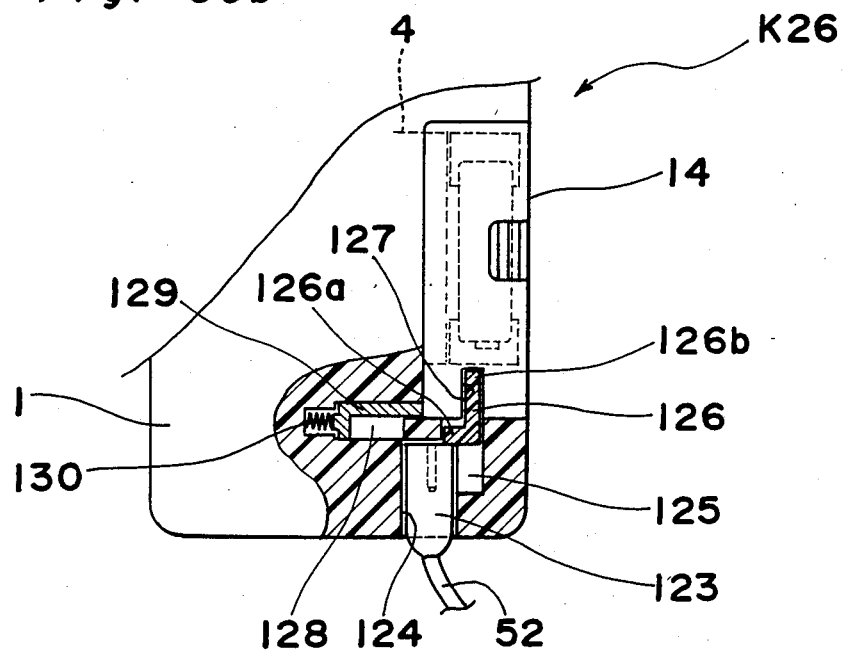
Figure 60C:
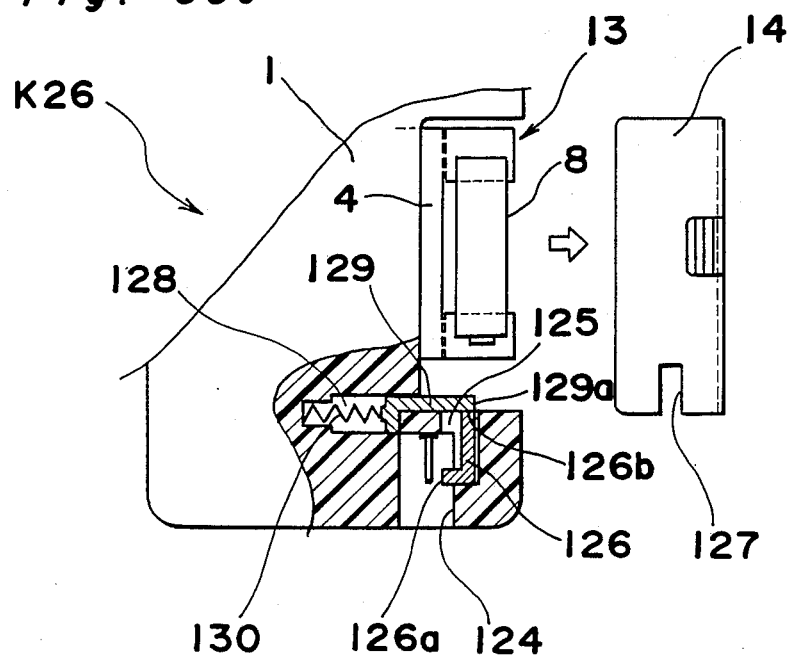

FIGS. 60a, 60b and 60c show a rechargeable type electric shaver K26 according to a 26th embodiment of the present invention. In the electric shaver K26, the battery outlet 13 is formed at one side face of the casing 1 and the plug inlet 124 is formed at the bottom face of the casing 1. The lid 14 is detachably mounted on the battery outlet 13. A lid locking means is provided between the lid 14 and the plug inlet 124. When the plug 123 of the power source cord 52 is inserted into the plug inlet 124, the lid locking means locks the lid 14 so as to prevent the lid 14 from being removed from the casing 1. Meanwhile, when the plug 123 has been drawn from the plug inlet 124, the lid locking means allows the lid 14 to be removed from the casing 1.

The lid locking means includes a guide groove 125 formed, between the battery outlet 13 and the plug inlet 124, on the casing 1 and a first lock piece 126 having an L-shaped cross section. The first lock piece 126 is vertically movably incorporated in the guide groove 125. One end 126a of the first lock piece 126 is projected into the plug inlet 124. Meanwhile, as shown in FIG. 60b, only when the first lock means 126 has been lifted, the other end 126b of the first lock means 126 is projected into the battery outlet 13 so as be brought into engagement with a recess 127 of the lid 14.

Furthermore, there is provided a charging preventing means for preventing the plug 123 from being inserted into the plug inlet 124 when the lid 14 has been removed from the casing 1. The charging preventing means includes a guide groove 128 formed, between the battery outlet 13 and the plug inlet 124, on the casing 1 and a second lock piece 129 having an L-shaped cross section. The second lock piece 129 is horizontally slidably incorporated in the guide groove 128 through a spring 130 such that one end 129a of the second lock piece 129 closes or opens, upon horizontal slide of the second lock piece 129, an upper end opening of the guide groove 125 confronting the battery outlet 13.

Therefore, as shown in FIG. 60a, when the plug 123 of the power source cord 52 is not being inserted into the plug inlet 124, namely when the electric shaver K26 is not being charged, the first lock piece 126 descends in the guide groove 125 by its own weight or by a downward urging force of a spring and the second lock piece 129 is depressed into the guide groove 128 against an urging force of the spring 130 by the lid 14. Thus, at this time, the lid 14 can be removed from the battery outlet 13.

However, when the plug 123 of the power source cord 52 has been inserted into the plug inlet 124 as shown in FIG. 60b, the first lock piece 126 is lifted by the plug 123 so as to bring the other end 126b of the first lock piece 126 into engagement with the recess 127 of the lid 14. Hence, the lid 14 cannot be removed from the battery outlet 13.

When the lid 14 has been removed from the battery outlet 13 in the state of FIG. 60a in order to take the rechargeable battery 5 out of the casing 1, the second lock piece 129 is projected into the battery outlet 13 by the urging force of the spring 130 as shown in FIG. 60c so as to close the guide groove 125 such that ascent of the first lock piece 126 is prevented. Therefore, at this time, even if the operator tries to insert the plug 123 of the power source cord 52 into the plug inlet 124, the end 126a of the first lock piece 126 prevents insertion of the plug 123 into the plug inlet 124. Consequently, since charging of the electric shaver K26 cannot be performed, such an erroneous operation can be prevented that the electric shaver K26 is charged at the time of removal of the rechargeable battery 5 from the battery outlet 13, thereby resulting in safe charging of the electric shaver K26.

Figure 61A:
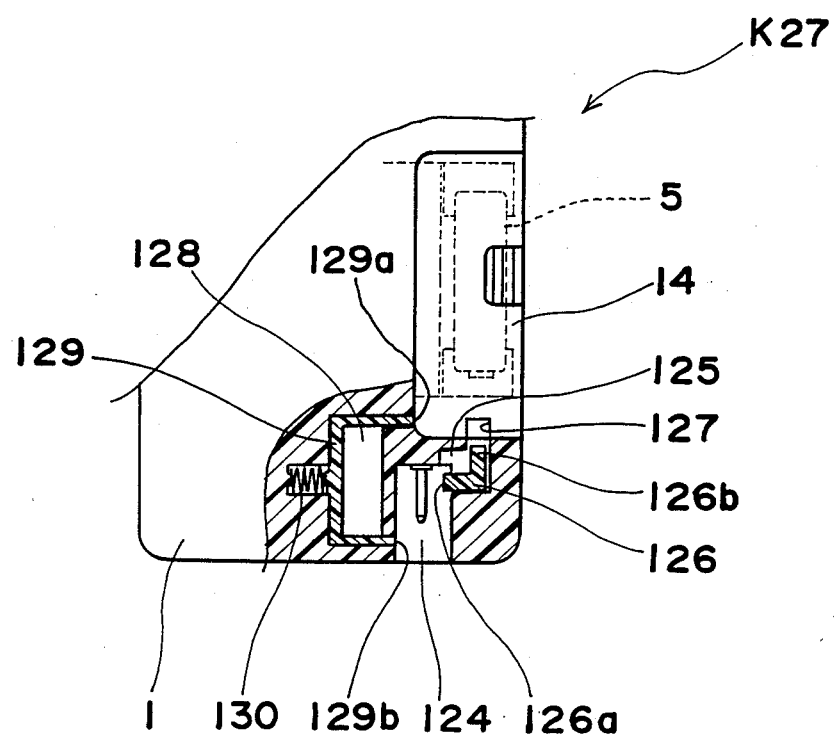
FIGS. 61a, 61b and 61c are views similar to FIGS. 60a, 60b and 60c, respectively, particularly showing a 27th embodiment of the present invention.
Figure 61B:
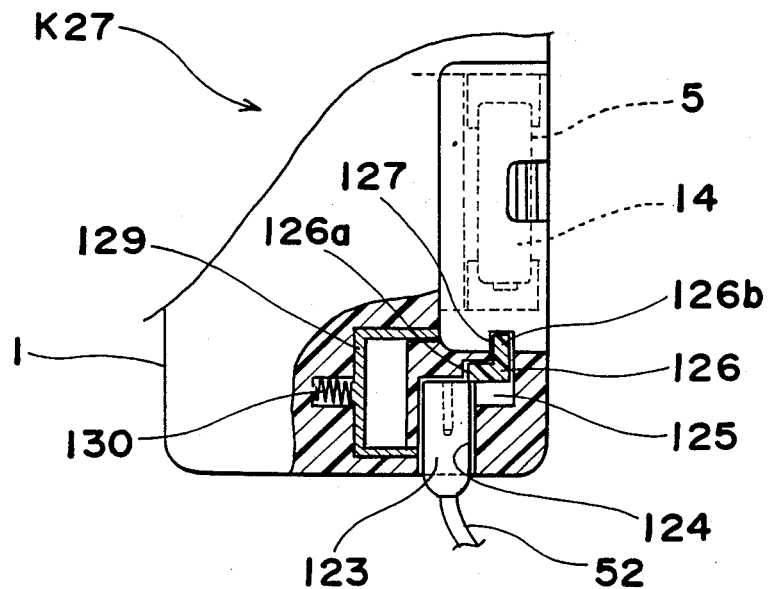
Figure 61C:
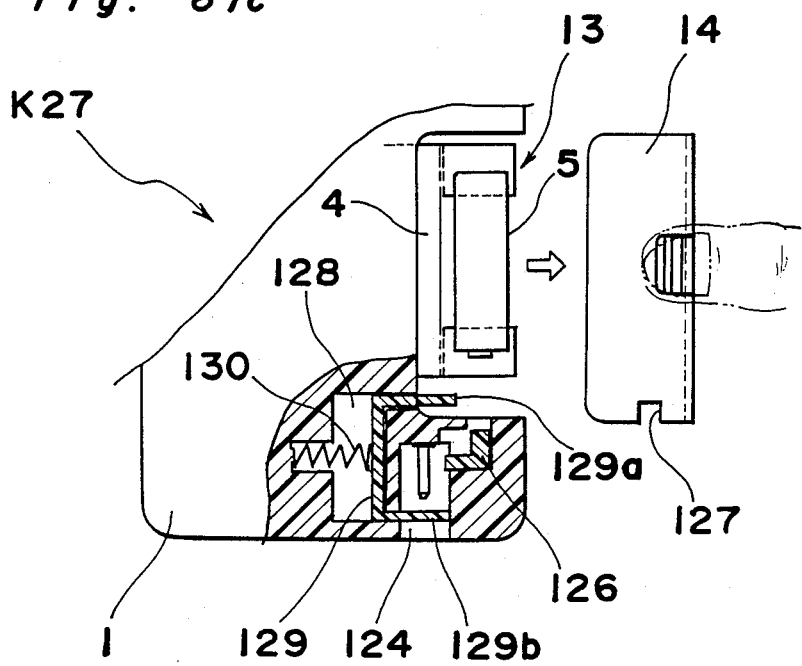

FIGS. 61a, 61b and 61c show a rechargeable type electric shaver K27 according to a 27th embodiment of the present invention. The electric shaver K27 is a modification of the electric shaver K26. In the electric shaver K27, the first lock piece 126 is incorporated between the battery outlet 13 and the plug inlet 124 of the casing 1 in the same manner as the electric shaver K26. However, the electric shaver K27 is different, in construction of the charging preventing means, from the electric shaver K26. Namely, in the electric shaver K27, the second lock piece 129 has a substantially U-shaped cross section and is horizontally slidably incorporated, through the spring 130, in the guide groove 128 formed between the battery outlet 13 and the plug inlet 124 of the casing 1. Furthermore, the ends 129a and 129b of the second lock piece 129 are arranged to retractably project into the battery outlet 13 and the plug inlet 124, respectively.

Thus, when the plug 123 of the power source cord 52 is not being inserted into the plug inlet 124 as shown in FIG. 61a, namely when the electric shaver K27 is not being charged, the first lock piece 126 descends in the guide groove 125 and the second lock piece 129 is depressed into the guide groove 128 against the urging force of the spring 130 by the lid 14. Hence, at this time, the lid 14 can be removed from the battery outlet 13.

However, when the plug 123 of the power source cord 52 has been inserted into the plug inlet 124 as shown in FIG. 61b, the first lock piece 126 is lifted by the plug 123 so as to bring the end 126b of the first lock piece 126 into engagement with the recess 127. Therefore, the lid 14 cannot be removed from the battery outlet 13.

When the lid 14 has been removed from the battery outlet 13 in the state of FIG. 61a in order to take the rechargeable battery 5 out of the casing 1, the ends 129a and 129b of the second lock piece 129 are, respectively, projected into the battery outlet 13 and the plug inlet 124 by the urging force of the spring 130 as shown in FIG. 61c such that the plug inlet 124 is closed by the end 129b. Hence, at this time, the plug 123 of the power source cord 52 cannot be inserted into the plug inlet 124 such that the electric shaver K27 cannot be charged.

Figure 62:
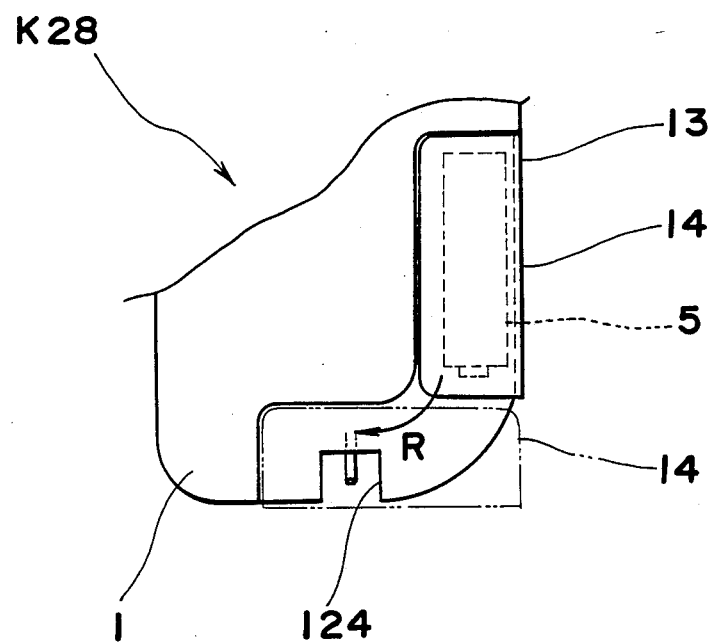
FIG. 62 is a fragmentary front elevational view of a rechargeable type small electric appliance according to a 28th embodiment of the present invention.

FIG. 62 shows a rechargeable type electric shaver K28 according to a 28th embodiment of the present invention. In the electric shaver K28, the battery outlet 13 is formed at the side face of the casing 1, while the plug inlet 124 is formed at the bottom face of the casing 1. When the lid 14 is slidably moved on the outer peripheral surface of the casing 1 perpendicularly in the direction of the arrow R from a state in which the lid 14 closes the battery outlet 13, the battery outlet 13 is opened and at the same time, the plug inlet 124 is closed by the lid 14. It is so arranged that once the lid 14 has been slid in the direction of the arrow R as described above, the lid 14 cannot be returned to the original position in the direction opposite to the direction of the arrow R. Therefore, when the battery outlet 13 is opened and the plug inlet 124 is closed by the lid 14 by sliding the lid 14 towards the plug inlet 124, the rechargeable battery 5 can be removed from the wiring board 4 but such an undesirable phenomenon does not take place that the operator receives an electric shock through inadvertent charging of the electric shaver K28. It is needless to say that the slits 106 for the plug blades 105 of the charging plug 3 in the electric shaver K22 may also be closed by the lid 14 in place of the plug inlet 124.

In the electric shavers K22 to K28, the rechargeable battery 5 is directly mounted on the wiring board 4 but may also be gripped between ribs projecting from the inner face of the casing 1 in a known manner.

In the rechargeable type small electric appliance according to the 22nd to 28th embodiments of the present invention, since the battery outlet 13 to be closed by the lid 14 is provided on the casing 1, the rechargeable battery 5 can be easily taken out of the battery outlet 13 by opening the lid 14 and removing the rechargeable battery 5 from the wiring board 4 without unreasonably destroying the casing 1 at random. Furthermore, since the lid 14 cannot be removed from the battery outlet 13 at the time of charging of the electric appliance, such an accident can be prevented that the operator receives an electric shock by taking the rechargeable battery 5 out of the casing 1 while the electric appliance is being connected to the external power source, thereby resulting in safe removal of the electric appliance.

Figure 63:
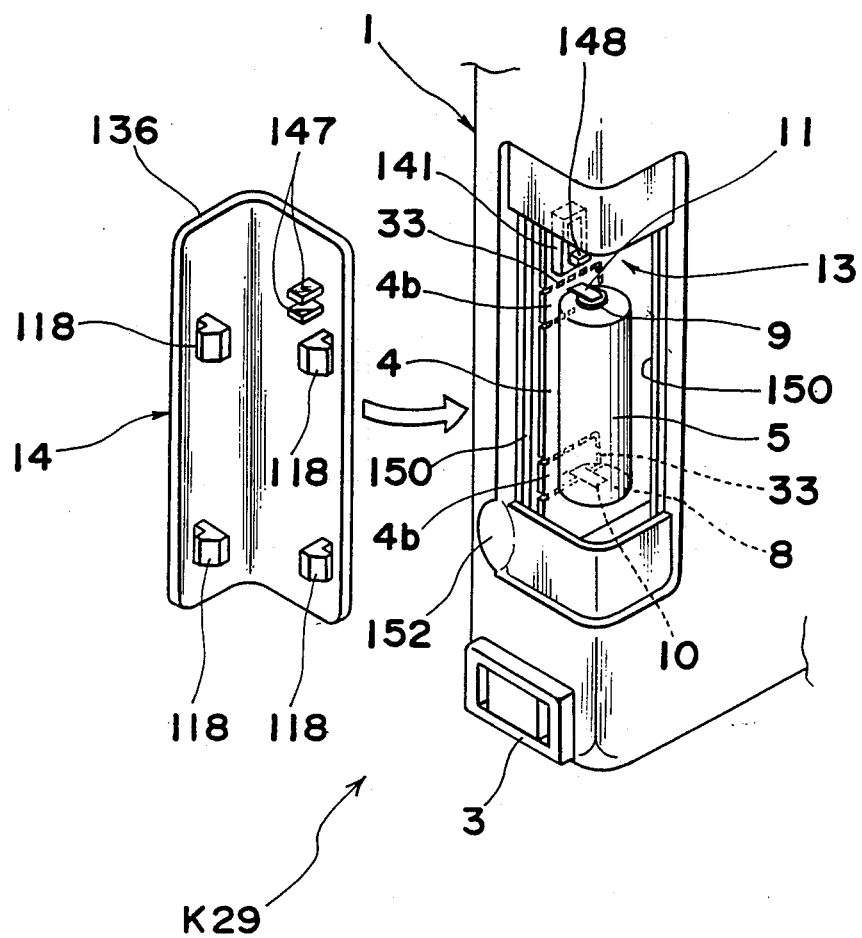
FIG. 63 is a fragmentary perspective view showing a state in which a lid has been removed from a rechargeable type small electric appliance according to a 29th embodiment of the present invention.
Figure 64:
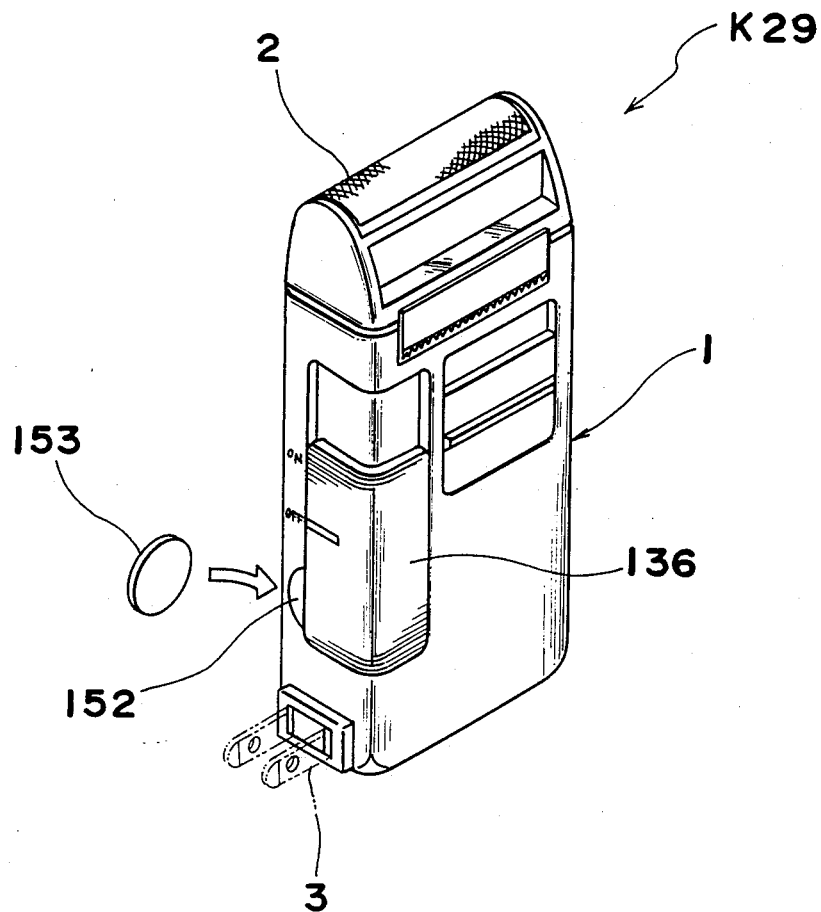
FIG. 64 is a perspective view of the electric appliance of FIG. 63.

FIGS. 63 to 67 show a rechargeable type electric shaver K29 according to a 29th embodiment of the present invention. In FIGS. 63 and 64, the electric shaver K29 includes the shaving blade unit 2 provided at the upper portion of the casing 1 and the charging plug 3 provided at the bottom portion of the casing 1. The battery outlet 13 opens at the side face and the front or rear face of the casing 1. The lid 14 is formed by a switch operating button 136 itself having an L-shaped cross section. The lid 14 is vertically slidably mounted on the battery outlet 13 so as to be displaced between an ON position (FIG. 65) for turning on a switch 141 and an OFF position (FIGS. 64 and 66) for turning off the switch 141.

Figure 67:
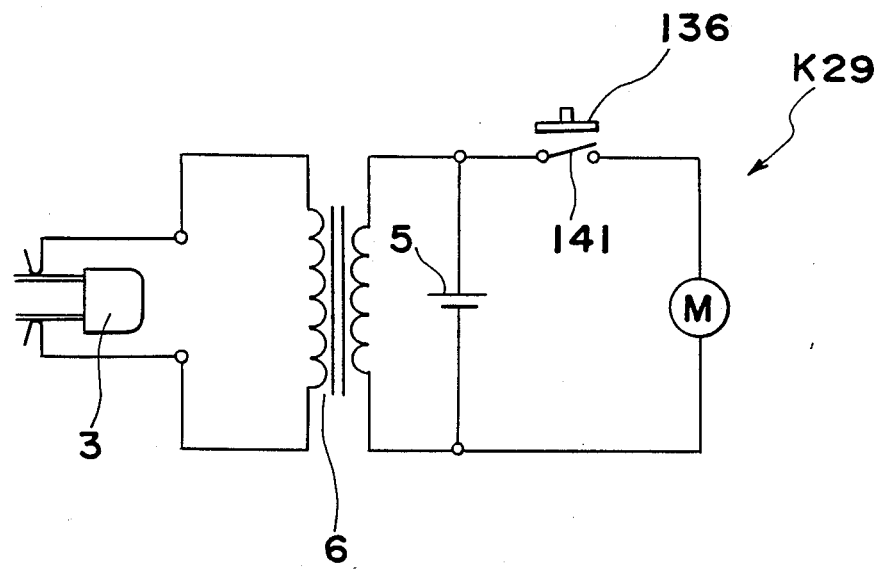
FIG. 67 is a circuit diagram of the electric appliance of FIG. 63.

A pattern corresponding to a circuit shown in FIG. 67, the rechargeable battery 5, the transformer 6, the switch 141, etc. are mounted on the wiring board 4. At least the rechargeable battery 5 and the switch 141 are so mounted on the wiring board 4 as to confront the battery outlet 13. An actuator 148 of the switch 141 is gripped between a pair of lips 147 formed on the inner face of the lid 14 such that the lips 147 turns on and off the actuator 148 when the lid 14 has been slid to the ON and OFF positions, respectively.

Figure 65:
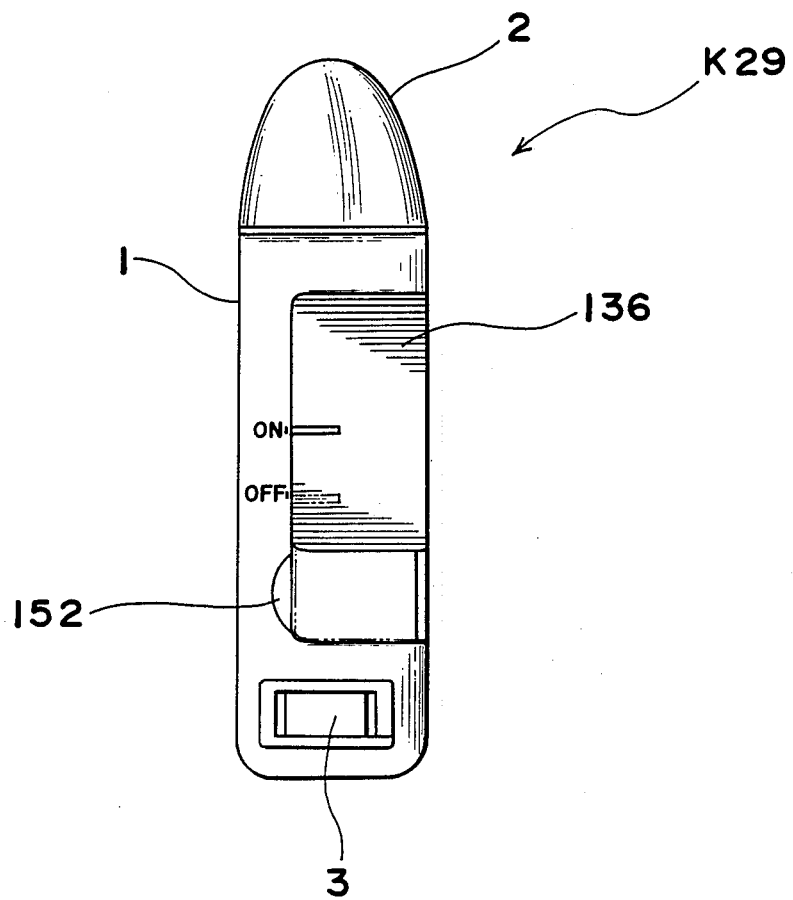
FIG. 65 is a side elevational view of the electric appliance of FIG. 63.
Figure 66:
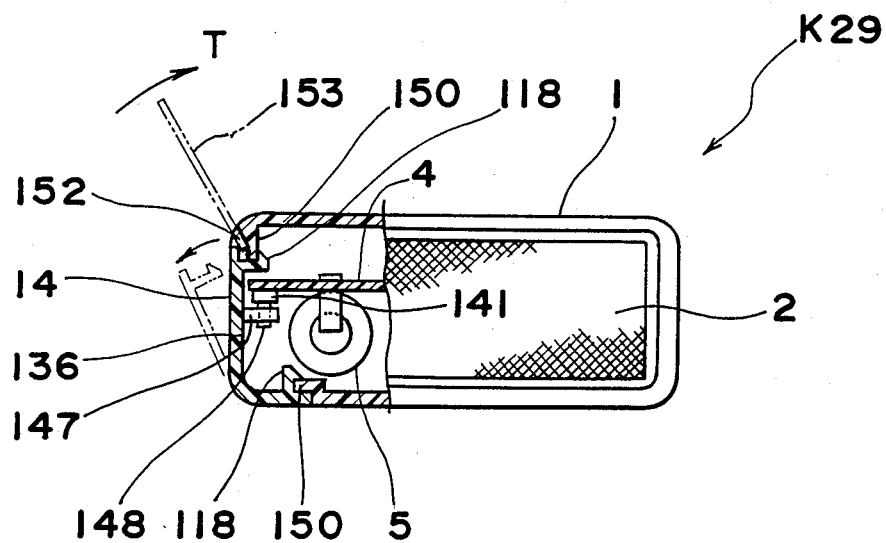
FIG. 66 is a partially sectional top plan view of the electric appliance of FIG. 63.

Meanwhile, a lid control means for controlling removal of the lid 14 is provided between the lid 14 and the casing 1. The lid control means functions to prevent removal of the lid 14 at the ON position but allow removal of the lid 14 at the OFF position. Namely, as shown in FIGS. 63 and 66, at least one pair of the engageable claws 118 are provided on the inner face of the lid 14. Meanwhile, a pair of wall pieces 150 engageable with the engageable claws 118, respectively are formed in the battery outlet 13. The engageable claws 118 are held in engagement with the wall pieces 150 so as to allow the lid 14 to slide vertically between the ON position and the OFF position. At the OFF position of the lid 14, the engageable claws 118 can be disengaged from the wall pieces 150. To this end, a cutout 152 for removing the lid 14 is provided at a lower portion of the battery outlet 13 as shown in FIGS. 64 and 66. As shown in FIG. 66, when a coin 153 or the like is inserted into the cutout 152 and then, the lid 14 is pried in the direction of the arrow T by the coin 153, the engageable claws 118 are disengaged from the wall pieces 150 such that the lid 14 is removed from the casing 1. On the other hand, at the ON position of the lid 14, since the lid 14 cannot be pried by the coin 153 as shown in FIG. 65 even if the coin 153 is inserted into the cutout 152, the lid 14 cannot be removed from the casing 1.

In order to take the rechargeable battery 5 out of the electric appliance K29, the lid 14 is slid to the OFF position as shown in FIGS. 64 and 66. Subsequently, after the switch 141 has been turned off, the coin 153 is inserted into the cutout 152 and then, the lid 14 is pried by the coin 153 such that the lid 14 is removed from the casing 1 as described above. Thus, by snapping off the peripheral portions 4b from the wiring board 4 along the snap line 33, the rechargeable battery 5 can be taken out of the battery outlet 13. Since the switch 141 is turned off at this time, the peripheral portions 4b can be snapped off from the wiring board 4 safely without such a risk as generation of sparks.

Figure 68:
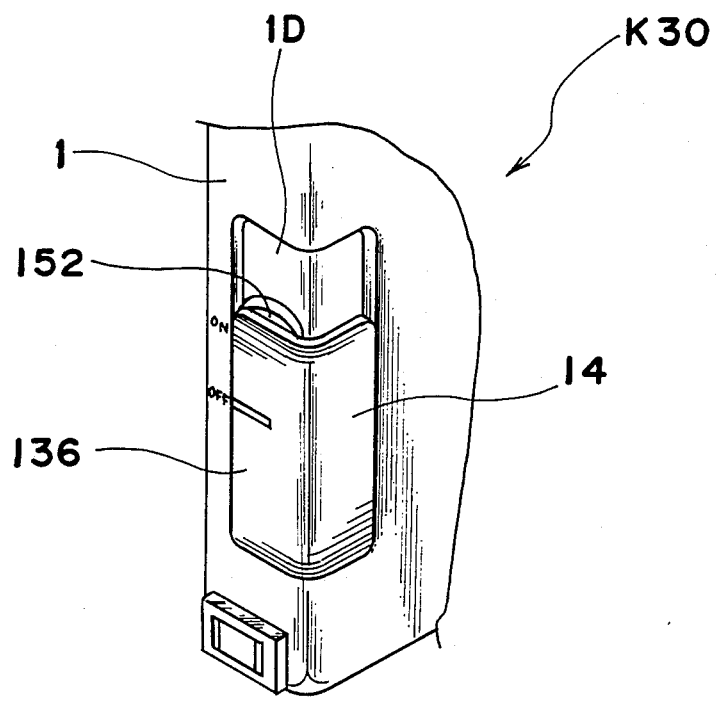
FIG. 68 is a fragmentary perspective view of a rechargeable type small electric appliance according to a 30th embodiment of the present invention.

FIG. 68 shows a rechargeable type electric shaver K30 according to a 30th embodiment of the present invention. The electric shaver K30 is a modification of the electric shaver K29 in connection with position of the cutout 152. In the electric shaver K30, the casing 1 has a wall face 1D in sliding contact with the inner face of the lid 14 and the cutout 152 is formed at a portion of the wall face 1D. The cutout 152 is completely covered by the lid 14 when the lid 14 is at the ON position. Meanwhile, when the lid 14 has been slid to the OFF position, the cutout 152 is exposed by the lid 14 such that the lid 14 can be pried by the coin 153 inserted into the cutout 152. Since other constructions of the electric shaver K30 are similar to those of the electric shaver K29, description thereof is abbreviated for the sake of brevity.

Figure 69:
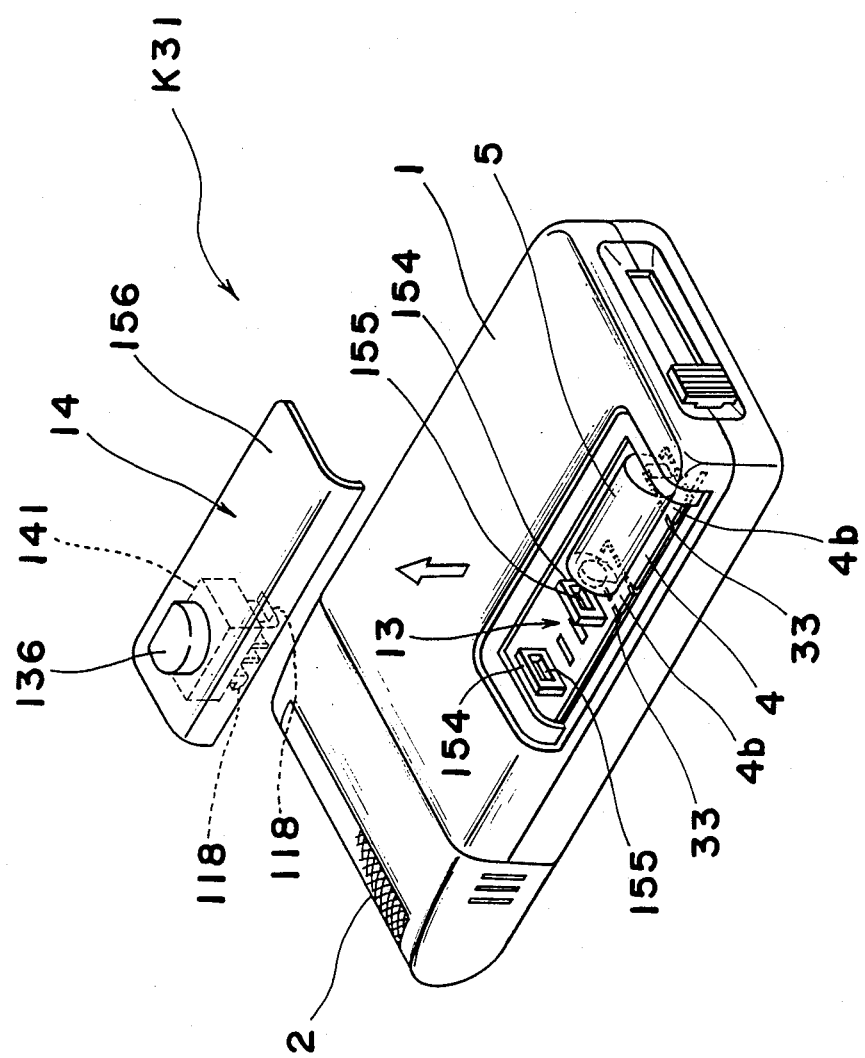
FIG. 69 is a perspective view showing a state in which a lid has been removed from a rechargeable type small electric appliance according to a 31st embodiment of the present invention.

Finally, FIG. 69 shows a rechargeable battery K31 according to a 31st embodiment of the present invention. The electric shaver K31 is different, in actuation mode of the switch 141 and construction of the lid 14, from the electric shaver K29. Namely, in the electric shaver K31, the switch operating button 136 is of push type and the lid 14 is formed by a holder plate 156 for holding the switch operating button 136 together with the switch 141. The lid control means provided between the lid 14 and the casing 1 includes a pair of the engageable claws 118 projecting from a box of the switch 141 and a retainer hole 155 formed on each of a pair of support pieces 154 projecting in the battery outlet 13 of the casing 1. The engageable claws 118 are, respectively, brought into engagement with the retainer holes 155 such that the battery outlet 13 is kept closed by the lid 14.

In an OFF state of the switch 141, in which the switch operating button 136 projects outwardly from the lid 14, the engageable claws 118 are disengaged from the retainer holes 155 by forcibly pulling the lid 14 with the use of the switch operating button 6 as a knob, so that the lid 14 can be removed from the battery outlet 13. However, in an ON state of the switch 141, in which the switch operating button 136 is substantially depressed into the lid 14, the switch operating button 136 cannot be used as a knob so as to disable removal of the lid 14. Other constructions of the electric shaver K31 are similar to those of the electric shaver K29.

In the rechargeable type small electric appliance according to the 29th to 31st embodiments of the present invention, since the battery outlet 13 to be closed by the lid 14 is provided on the casing 1, the rechargeable battery 5 can be efficiently taken out of the battery outlet 13 by opening the lid 14 and removing the rechargeable battery 5 from the wiring board 4 without unreasonably destroying the casing 1 at random. Furthermore, since the lid 14 cannot be removed from the casing 1 before the switch 141 is turned off, the rechargeable battery 5 can be taken out of the casing 1 safely without generation of sparks even when the rechargeable battery 5 whose electric power has not yet been consumed completely is taken out of the casing 1. Meanwhile, since the switch 141 cannot be turned on after the lid 14 has been removed from the casing 1, such a risk is not incurred that the switch 141 is in the ON state when the rechargeable battery 5 is taken out of the casing 1, thereby resulting in safe removal of the rechargeable battery 5.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A rechargeable type small electric appliance including a rechargeable battery having negative and positive terminals, said negative and positive terminals being, respectively, connected to a wiring board by a pair of lead members,
    wherein at least one of said lead members is bent in an inverse U-shape so as to have first and second pieces and a bent portion connecting said first and second pieces,
    said first piece being secured to said wiring board, while said second piece is clamped, at a clamp portion thereof, to a corresponding one of said negative and positive terminals,
    said bent portion projecting outwardly beyond said clamp portion of said second piece in a radial direction of said rechargeable battery.

2. A rechargeable type small electric appliance including a rechargeable battery having negative and positive terminals, said negative and positive terminals being, respectively, connected to a wiring board by first and second lead pieces, said rechargeable type small electric appliance comprising:

a support base for supporting a longitudinal center of said rechargeable battery, which is provided on said wiring board;

said rechargeable battery, when a depressing load is alternately applied to opposite ends of said rechargeable battery, being pivotally swung at said support base as a fulcrum such that said first and second lead pieces are cut off from said wiring board.

3. A rechargeable type small electric appliance including a rechargeable battery mounted on a wiring board, said wiring board having a first peripheral portion of a first joint connected to a negative terminal of said rechargeable battery and a second peripheral portion of a second joint connected to a positive terminal of said rechargeable battery, wherein a snap line is formed at at least said first and second peripheral portions such that said first and second peripheral portions are snapped off from said wiring board along the snap line.

4. A rechargeable type small electric appliance including a rechargeable battery mounted on a wiring board, said wiring board having a first peripheral portion of a first joint connected to a negative terminal of said rechargeable battery and a second peripheral portion of a second joint connected to a positive terminal of said rechargeable battery, wherein a snap line is formed at at least said first and second peripheral portions such that said first and second peripheral portions are snapped off from said wiring board along the snap line, wherein each of said first and second peripheral portions has an inserting portion engageable with a lid for covering said rechargeable battery.

5. A rechargeable type small electric appliance including a rechargeable battery mounted on a wiring board, said wiring board having a first peripheral portion of a first joint connected to a negative terminal of said rechargeable battery and a second peripheral portion of a second joint connected to a positive terminal of said rechargeable battery, wherein a snap line is formed at at least said first and second peripheral portions such that said first and second peripheral portions are snapped off from said wiring board along the snap line, wherein each of said first and second peripheral portions has an inserting portion engageable with an accessory of said rechargeable type small electric appliance.

6. A rechargeable type small electric appliance including a rechargeable battery connected to a battery support plate, said battery support plate being detachably coupled with a wiring board, wherein a pattern corresponding to an input circuit is formed on said wiring board and a portion of said pattern is formed on said battery support plate.

7. A rechargeable type small electric appliance including a rechargeable battery connected to a battery support plate, said battery support plate being formed separately from a wiring board and being detachably mounted on said wiring board, wherein a pattern corresponding to an input circuit is formed on said wiring board and a portion of said pattern is formed on said battery support plate.

8. A rechargeable type small electric appliance comprising:

a rechargeable battery which acts as a power source of said rechargeable type small electric appliance;

a casing which is formed with a battery outlet for receiving said rechargeable battery;

said rechargeable battery being detachably accommodated in said casing so as to confront said battery outlet;

a lid for covering said rechargeable battery, which is detachably mounted on said battery outlet; and means for preventing said lid from being detached from said battery outlet only at the time of charging of said rechargeable type small electric appliance.

9. A rechargeable type small electric appliance as claimed in claim 8, wherein said means includes a pair of slits provided for a pair of plug blades of a charging plug, respectively, said slits being formed, side by side with said battery outlet, on said casing such that said plug blades retractably project from said slits, respectively, said plug blades projecting in a direction for detaching said lid from said battery outlet.

10. A rechargeable type small electric appliance as claimed in claim 8, wherein said means includes an inlet for receiving a charging plug of a power source cord, said inlet being formed on said lid.

11. A rechargeable type small electric appliance as claimed in claim 8, wherein said means includes a charging plug provided on said lid.

12. A rechargeable type small electric appliance as claimed in claim 8, wherein said means includes an inlet for receiving a charging plug of a power source cord, said inlet being formed on said lid, said rechargeable type small electric appliance further comprising:

a lid locking means for locking said lid, which is provided between said inlet and said lid;

said lid locking means locking said lid upon insertion of said charging plug into said inlet and enabling said to be detached from said battery outlet upon draw of said charging plug from said inlet.

13. A rechargeable type small electric appliance as claimed in claim 8, wherein said means includes an inlet for receiving a charging plug of a power source cord. said inlet being formed on said lid, said rechargeable type small electric appliance further comprising:

a lid locking means for locking said lid, which is provided between said inlet and said lid;

said lid locking means locking said lid upon insertion of said charging plug into said inlet and enabling said lid to be detached from said battery outlet upon draw of said charging plug from said inlet; and a charging preventing means for preventing insertion of said charging plug into said inlet upon detachment of said lid from said battery outlet.

14. A rechargeable type small electric appliance comprising:

a casing which is formed with a battery outlet;

a rechargeable battery acting as a power source for said rechargeable type small electric appliance, which is detachably accommodated in said casing through said battery outlet;

a lid for covering said battery outlet, which acts also as a switch operating button for opening and closing a switch of said rechargeable battery; and a lid control means for controlling removal of said lid from said battery outlet, which is provided between said lid and said casing;

said lid control means preventing removal of said lid from said battery outlet in an ON state of said switch operating button and enabling removal of said lid from said battery outlet in an OFF state of said switch operating button.

15. A rechargeable type small electric appliance comprising:

a casing which is formed with a battery outlet;

a rechargeable battery acting as a power source for said rechargeable type small electric appliance, which is detachably accommodated in said casing through said battery outlet;

a lid for covering said battery outlet;

a switch operating button for opening and closing a switch of said rechargeable battery, which is mounted on said lid; and a lid control means for controlling removal of said lid from said battery outlet, which is provided between said lid and said casing;

said lid control means preventing removal of said lid from said battery outlet in an ON state of said switch operating button and enabling removal of said lid from said battery outlet in an OFF state of said switch operating button.

* * * * *